(12) United States Patent
Kim et al.

(10) Patent No.: US 11,463,110 B2
(45) Date of Patent: Oct. 4, 2022

(54) MEMORY CONTROLLERS AND MEMORY SYSTEMS INCLUDING THE SAME

(71) Applicant: Samsung Electronics Co., Ltd., Suwon-si (KR)

(72) Inventors: Sungrae Kim, Seoul (KR); Kijun Lee, Seoul (KR); Myungkyu Lee, Seoul (KR); Sunghye Cho, Hwaseong-si (KR); Chanki Kim, Ansan-si (KR); Yeonggeol Song, Seoul (KR)

(73) Assignee: Samsung Electronics Co., Ltd.

( * ) Notice: Subject to any disclaimer, the term of this patent is extended or adjusted under 35 U.S.C. 154(b) by 243 days.

(21) Appl. No.: 16/987,554

(22) Filed: Aug. 7, 2020

(65) Prior Publication Data
US 2021/0194508 A1 Jun. 24, 2021

(30) Foreign Application Priority Data
Dec. 23, 2019 (KR) .................. 10-2019-0172779

(51) Int. Cl.
*H03M 13/00* (2006.01)
*H03M 13/15* (2006.01)
*G06F 9/30* (2018.01)
*G06F 11/10* (2006.01)
*H03M 13/11* (2006.01)

(52) U.S. Cl.
CPC .... *H03M 13/1575* (2013.01); *G06F 9/30189* (2013.01); *G06F 11/1044* (2013.01); *G06F 11/1068* (2013.01); *H03M 13/1105* (2013.01); *H03M 13/1515* (2013.01)

(58) Field of Classification Search
CPC ......... H03M 13/1575; H03M 13/1105; H03M 13/1515; G06F 9/30189; G06F 11/1044; G06F 11/1068
See application file for complete search history.

(56) References Cited

U.S. PATENT DOCUMENTS

| | | | |
|---|---|---|---|
| 5,778,009 A | 7/1998 | Fredrickson et al. | |
| 6,367,046 B1 | 4/2002 | Chapman et al. | |
| 6,453,440 B1* | 9/2002 | Cypher | G06F 11/1024 |
| | | | 714/E11.046 |
| 6,907,559 B2* | 6/2005 | Hall | G11B 20/1833 |
| | | | 714/755 |
| 7,162,679 B2 | 1/2007 | Liberol et al. | |
| 7,404,134 B2 | 7/2008 | Le Bars et al. | |
| 7,814,398 B2 | 10/2010 | Djurdjevic et al. | |

(Continued)

*Primary Examiner* — Esaw T Abraham
(74) *Attorney, Agent, or Firm* — Myers Bigel, P.A.

(57) ABSTRACT

A memory controller includes an error correction circuit and a central processing unit (CPU) to control the error correction circuit. The error correction circuit includes an error correction code (ECC) decoder and a memory to store a parity check matrix. The ECC decoder performs an ECC decoding on a codeword read from the memory module to: (i) generate a first syndrome and a second syndrome, (ii) generate a decoding mode flag associated with a type of errors in the codeword based on the second syndrome and a decision syndrome, (iii) operate in one of a first decoding mode and a second decoding mode based on the decoding mode flag, and (iv) selectively correct one of a chip error associated with one of the data chips and one or more symbol errors in the codeword.

20 Claims, 25 Drawing Sheets

(56) References Cited

U.S. PATENT DOCUMENTS

| | | | |
|---|---|---|---|
| 8,176,391 B2 * | 5/2012 | Baysah | G06F 11/1044 714/781 |
| 8,250,435 B2 | 8/2012 | Blankenship et al. | |
| 8,522,122 B2 * | 8/2013 | Alves | H03M 13/13 714/784 |
| 8,549,378 B2 * | 10/2013 | Alves | H03M 13/3761 714/763 |
| 9,043,674 B2 * | 5/2015 | Wu | H03M 13/616 714/761 |
| 9,195,551 B2 | 11/2015 | Das et al. | |
| 10,353,770 B2 | 7/2019 | Lee et al. | |
| 10,467,091 B2 * | 11/2019 | Park | G11C 11/5628 |

* cited by examiner

FIG. 9

IM $$\begin{matrix} 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{matrix}$$

FIG. 10

RSM(k+1)

| $\alpha^{4k-4}$ | $\alpha^{4k-3}$ | $\alpha^{4k-2}$ | $\alpha^{4k-1}$ |
|---|---|---|---|
| $\alpha^{(4k-4)\times 2}$ | $\alpha^{(4k-3)\times 2}$ | $\alpha^{(4k-2)\times 2}$ | $\alpha^{(4k-1)\times 2}$ |
| $\alpha^{(4k-4)\times 3}$ | $\alpha^{(4k-3)\times 3}$ | $\alpha^{(4k-2)\times 3}$ | $\alpha^{(4k-1)\times 3}$ |
| $\alpha^{(4k-4)\times 4}$ | $\alpha^{(4k-3)\times 4}$ | $\alpha^{(4k-2)\times 4}$ | $\alpha^{(4k-1)\times 4}$ |

RSM1

| IM | $\alpha$ | $\alpha^2$ | $\alpha^3$ |
|---|---|---|---|
| IM | $\alpha^2$ | $\alpha^4$ | $\alpha^6$ |
| IM | $\alpha^3$ | $\alpha^6$ | $\alpha^9$ |
| IM | $\alpha^4$ | $\alpha^8$ | $\alpha^{12}$ |

PGM

FIG. 19

| SPC Syndrome Check | RS Syndrome Check | Mode |
|---|---|---|
| Zero | Nonzero | RS Mode |
| 1 Symbol error | Nonzero | |
| 2 Symbol error | | |
| 3 or 4 Symbol Error | Nonzero | Chipkill Mode |

MEMORY CONTROLLERS AND MEMORY SYSTEMS INCLUDING THE SAME

REFERENCE TO PRIORITY APPLICATION

This application claims priority under 35 U.S.C. § 119 to Korean Patent Application No. 10-2019-0172779, filed Dec. 23, 2019, the disclosure of which is hereby incorporated herein by reference in its entirety.

TECHNICAL FIELD

Some example embodiments of the present disclosure relate to memories, and more particularly, to memory controllers and memory systems including the same.

DISCUSSION OF RELATED ART

A memory device may be implemented using a semiconductor material such as silicon (Si), germanium (Ge), gallium arsenide (GaAs), indium phosphide (InP), or the like. Memory devices are typically divided into volatile memory devices and nonvolatile memory devices.

A volatile memory device refers to a memory device in which stored data is lost when a power supply is shut down. On the other hand, a nonvolatile memory device refers to a memory device that retains stored data when a power supply is removed. Because a dynamic random access memory (DRAM), which is a type of volatile memory, has a high access speed, the DRAM is widely used as a working memory, a buffer memory, a main memory, or the like when used in a computing system.

SUMMARY

Some example embodiments provide a memory controller capable of efficiently correcting errors occurring in a memory module.

Some example embodiments provide a memory system that includes a memory controller capable of efficiently correcting errors occurring in a memory module.

According to some example embodiments, a memory controller includes an error correction circuit and a central processing unit (CPU) to control the error correction circuit. The error correction circuit includes an error correction code (ECC) decoder and a memory to store a parity check matrix. The ECC decoder performs an ECC decoding on a codeword read from the memory module. This ECC decoding includes: (i) generating a first syndrome and a second syndrome, (ii) generating a decoding mode flag associated with a type of errors in the codeword based on the second syndrome and a decision syndrome, (iii) operating in one of a first decoding mode and a second decoding mode based on the decoding mode flag, and (iv) selectively correcting one of a chip error associated with one of the data chips and one or more symbol errors in the codeword.

According to some example embodiments, a memory system includes a memory module and a memory controller to control the memory module. The memory module includes a plurality of data chips, a first parity chip and a second parity chip. The memory controller includes an error correction circuit and a central processing unit (CPU) to control the error correction circuit. The error correction circuit includes an error correction code (ECC) decoder and a memory to store a parity check matrix. The ECC decoder performs an ECC decoding on a codeword read from the memory module to thereby generate a first syndrome and a second syndrome, generate a decoding mode flag associated with a type of errors in the codeword based on the second syndrome and a decision syndrome, operate in one of a first decoding mode and a second decoding mode based on the decoding mode flag, and selectively correct one of a chip error associated with one of the data chips and one or more symbol errors in the codeword.

According to some example embodiments, a memory controller to control a memory module having a plurality of data chips, a first parity chip and a second parity chip therein includes an error correction circuit and a central processing unit (CPU) to control the error correction circuit. The error correction circuit includes an error correction code (ECC) encoder, an ECC decoder and a memory to store a parity generation matrix and a parity check matrix. The ECC encoder performs ECC encoding on a user data set to generate a first parity data and a second parity data using the parity generation matrix and provides the memory module with a codeword including the user data set, the first parity data and the second parity data. The ECC decoder performs an ECC decoding on a codeword read from the memory module to: (i) generate a first syndrome and a second syndrome, (ii) generate a decoding mode flag associated with a type of errors in the codeword based on the second syndrome and a decision syndrome, (iii) operate in one of a first decoding mode and a second decoding mode based on the decoding mode flag, and (iv) selectively correct one of a chip error associated with one of the data chips and one or more symbol errors in the codeword.

According to some example embodiments, an ECC decoder in a memory controller may perform an ECC decoding on a codeword read from a memory module to thereby generate a first syndrome using a first check matrix of a parity check matrix, and to generate a second syndrome using a second check matrix of the parity check matrix. The decoder may determine a type of errors in the codeword based on the first syndrome and the second syndrome and may correct multi errors in multiple chips or three or more symbol errors in one chip based on a decoding mode. Therefore, the memory controller may correct various types of errors efficiently.

BRIEF DESCRIPTION OF THE DRAWINGS

The above and other features of the present disclosure will become more apparent by describing in detail example embodiments thereof with reference to the accompanying drawings.

FIG. 9 illustrates a unit matrix in FIG. 8.

FIG. 10 illustrates a portion of the Galois field sub matrixes in FIG. 7.

FIG. 19 is a table illustrating various types of errors which the ECC decoder determines based on the first syndrome and the second syndrome.

DETAILED DESCRIPTION OF THE EMBODIMENTS

Figure 1:
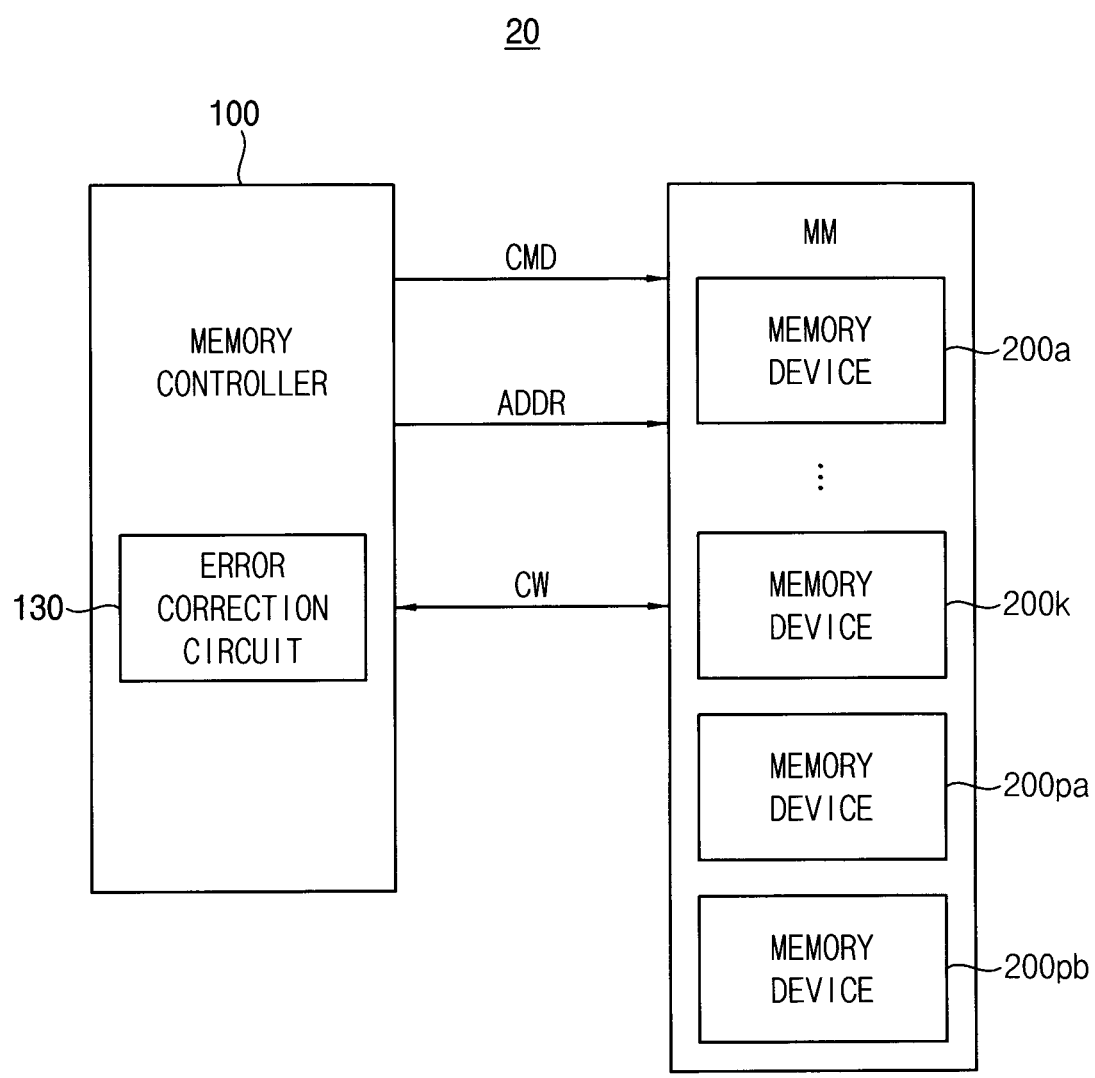
FIG. 1 is a block diagram illustrating a memory system, according to example embodiments.

Example embodiments of the present disclosure will be described more fully hereinafter with reference to the accompanying drawings. Like reference numerals may refer to like elements throughout the accompanying drawings.

FIG. 1 is a block diagram illustrating a memory system according to example embodiments. Referring to FIG. 1, a memory system 20 may include a memory controller 100 and a memory module MM. The memory module MM includes a plurality of memory chips 200a~200k, 200pa and 200pb. The plurality of memory chips 200a~200k, 200pa and 200pb include a plurality of data chips 200a~200k and a first parity chip 200pa and a second parity chip 200pb.

The memory controller 100 may control an overall operation of the memory system 20. The memory controller 100 may control an overall data exchange between a host and the plurality of memory chips 200a~200k, 200pa and 200pb. For example, the memory controller 100 may write data into the plurality of memory chips 200a~200k, 200pa and 200pb or read data from the plurality of memory chips 200a~200k, 200pa and 200pb in response to a request/command from the host. In addition, the memory controller 30 may issue operation commands to the plurality of memory chips 200a~200k, 200pa and 200pb for controlling the plurality of memory chips 200a~200k, 200pa and 200pb.

In example embodiments, each of the plurality of memory chips 200a~200k, 200pa and 200pb includes volatile memory cells such as a dynamic random access memory (DRAM). In other example embodiments, each of the plurality of memory chips 200a~200k, 200pa and 200pb includes nonvolatile memory cells such as a Nand flash memory device. In this case, the memory system 20 may correspond to a solid state drive (SSD).

In example embodiments, a number of the data chips 200a~200k may be 16, but the number of the data chips 200a~200k is not limited thereto. In example embodiments, each of the data chips 200a~200k may be referred to as a data memory, and each of the parity chips 200pa and 200pb may be referred to as an error correction code (ECC) memory, or a redundant memory.

The memory controller 100 transmits an address ADDR and a command CMD to the memory module MM and may exchange a codeword CW from the memory module MM.

The memory controller 100 may include an error correction circuit 130 and the error correction circuit 130 may perform an error correction code (ECC) encoding on a user data set using a parity generation matrix to generate a parity data set and may provide the memory module MM with the codeword including the user data set and the parity data set in a write operation of the memory system 20. The user data set may be stored in the data chips 200a~200k, a first portion of the parity data set may be stored in the first parity chip 200pa and a second portion of the parity data set may be stored in the second parity chip 200pb.

In addition, the error correction circuit 130 may perform an ECC decoding on the codeword CW read from the memory module MM using a parity check matrix to generate a first syndrome and a second syndrome, may generate a decoding mode flag associated with a type of errors in the codeword CW based on the first syndrome and the second syndrome, may operate one of a first decoding mode and a second decoding mode based on the decoding mode flag, and may selectively correct one of a chip error in the codeword CW and one or more symbol errors in the codeword CW. The chip error may be associated with one of the data chips 200a~200k and the one or more symbol errors may be associated with symbols in the codeword CW. Accordingly, the error correction circuit 130 may correct the chip error associated with errors in one data chip and multi errors occurring in multiple data chips and may correct various types of errors.

Figure 2:
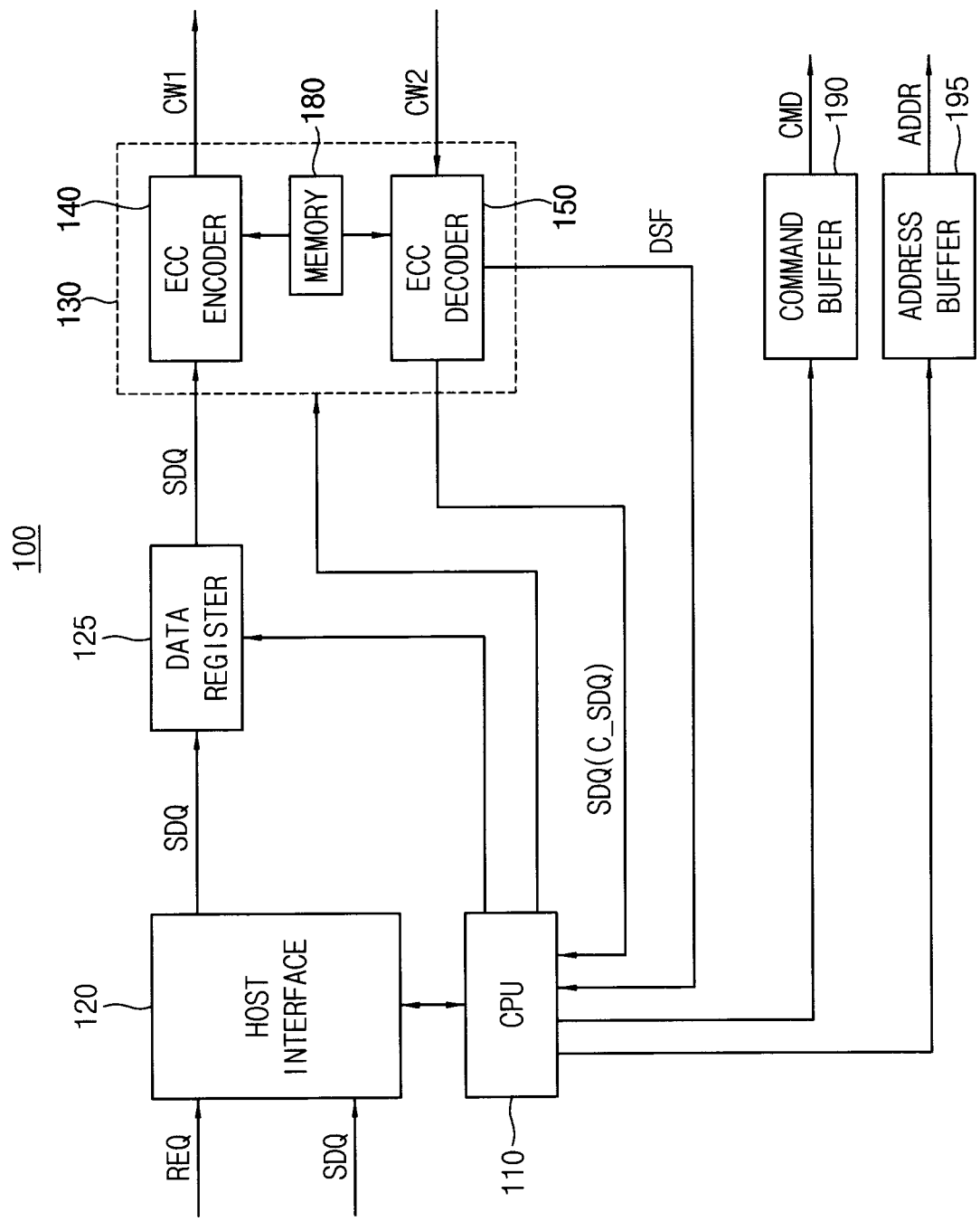
FIG. 2 is block diagram illustrating the memory controller in the memory system of FIG. 1 according to example embodiments.

FIG. 2 is block diagram illustrating the memory controller in the memory system of FIG. 1 according to example embodiments. Referring to FIG. 2, the memory controller 100 includes a central processing unit (CPU) 110, a host interface 120, a data register 125, the error correction circuit 130, a command buffer 190 and an address buffer 195. The error correction circuit 130 includes an ECC encoder 140, an ECC decoder 150 and an (ECC) memory 180.

The host interface 120 receives a request REQ and a user data set SDT from the host, and provides the user data set SDT to the data register 125. The data register 125 provides the user data set SDT to the error correction circuit 130. The ECC encoder 140 may perform an ECC encoding on the user data set SDQ using a parity generation matrix to generate a first codeword CW1. In contrast, the ECC decoder 150 may perform an ECC decoding on a codeword CW2 provided from the memory module MM using a parity check matrix to correct errors in the codeword CW2, provide the CPU 110 with one of the user data set SDQ and a corrected user data set C_SDQ and provide the VPU 110 with an error flag signal DSF associated with error correction. The memory 180 may store the parity generation matrix and the parity check matrix.

The CPU 110 receives the user data set SDQ or the corrected user data set C_SDQ and controls the error correction circuit 130, the command buffer 190 and the address buffer 195. The command buffer 190 stores the command CMD corresponding to the request REQ and transmits the command CMD to the memory module MM under control of the CPU 110. The address buffer 195 stores the address ADDR and transmits the address ADDR to the memory module MM under control of the CPU 110.

Figure 3:
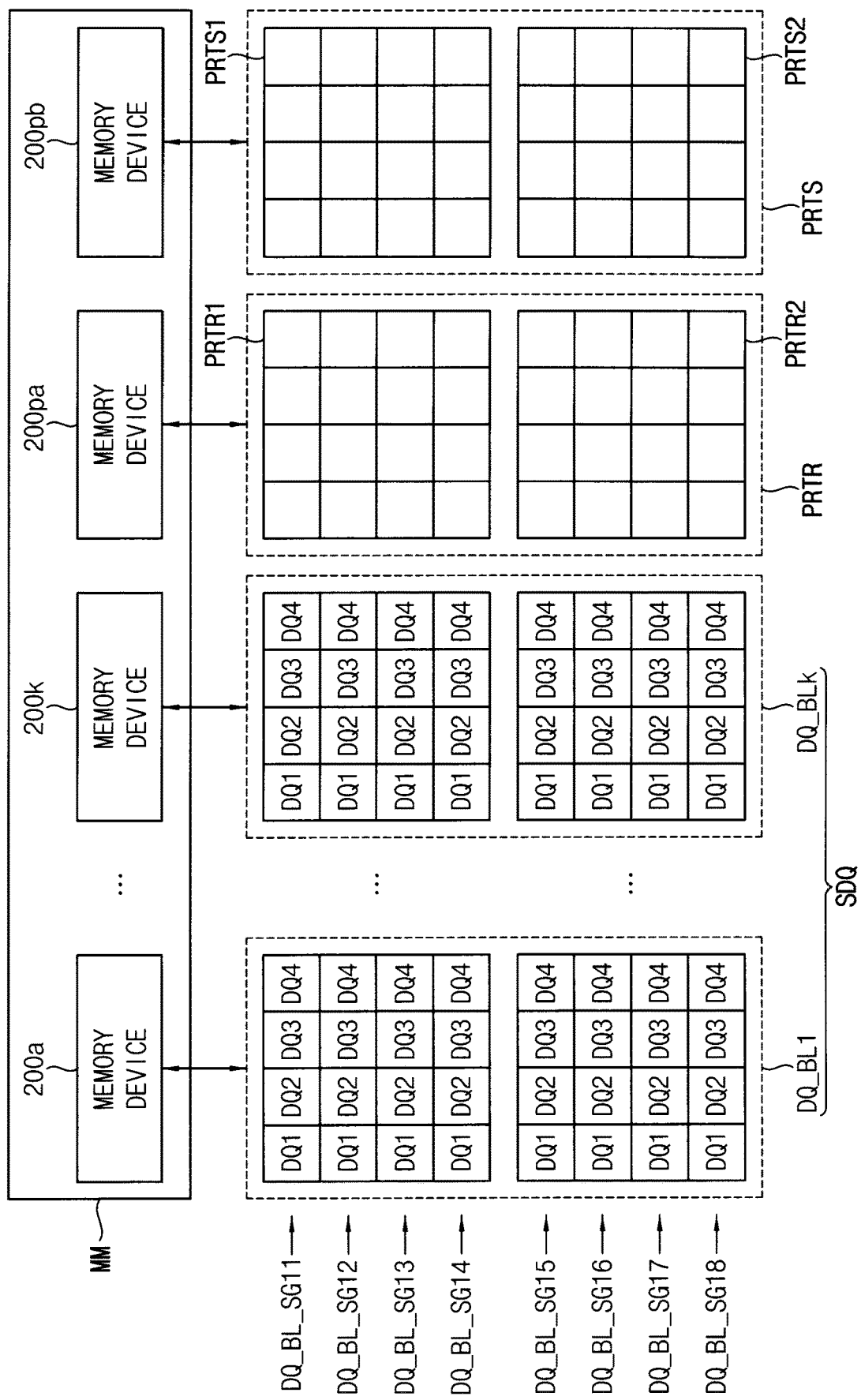
FIG. 3 illustrates data sets corresponding to the plurality of burst lengths in the memory system of FIG. 1, according to example embodiments.

FIG. 3 illustrates data sets corresponding to the plurality of burst lengths in the memory system of FIG. 1, according to example embodiments. Referring to FIG. 3, each of the data chips 200a~200k and the parity chips 200pa and 200pb may perform a burst operation. Herein, the burst operation refers to an operation of writing or reading a large amount of data by sequentially increasing or decreasing an initial address provided from the memory controller 100. A basic unit of the burst operation may be referred to a burst length BL.

Referring to FIG. 3, each of the data sets DQ_BL1~DQ_BLk corresponding to the plurality of burst lengths are input to/output from each of the data chips 200a~200k. Each of the data sets DQ_BL1~DQ_BLk may include data segments DQ_BL_SG11~DQ_BL_SG18 corresponding to each burst length of the plurality of burst lengths. The data sets DQ_BL1~DQ_BL18 may correspond to the user data set SDQ. The burst length is assumed to be eight (8) in FIG. 3 and it is assumed that a burst operation is performed once. While the burst operation is performed in each of the data chips 200a~200k, a first parity data PRTR corresponding to the plurality of burst lengths are input to/output from are input to/output from the first parity chip 200pa and a second parity data PRTS corresponding to the plurality of burst lengths are input to/output from are input to/output from the second parity chip 200pb. The second parity data PRTS may include a first portion PRTS1 and a second portion PRTS2 and the first parity data PRTR may include a first portion PRTR1 and a second portion PRTR2

Figure 4:
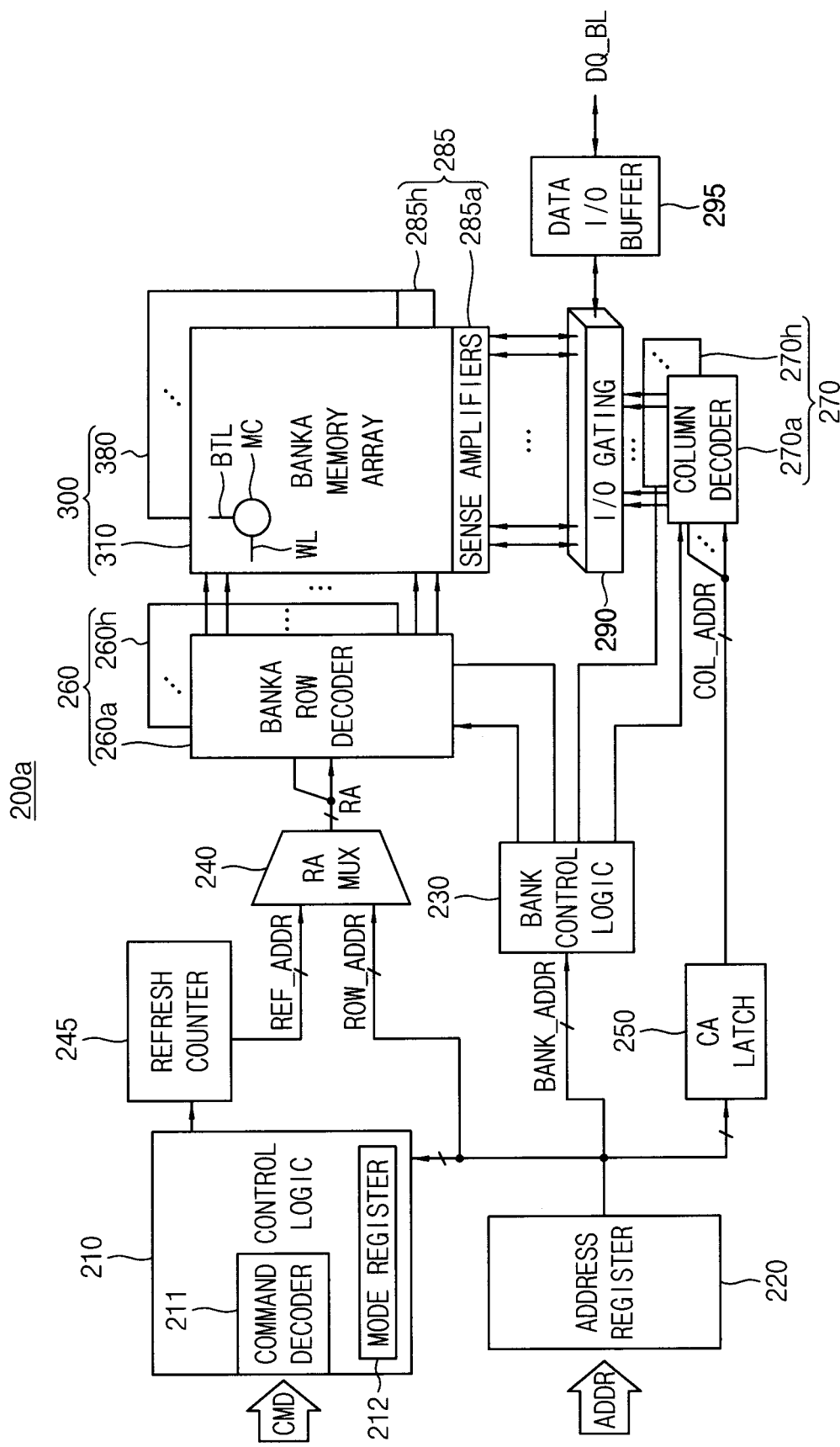
FIG. 4 is a block diagram illustrating one of the data chips in the memory module of FIG. 1 according to example embodiments.

FIG. 4 is a block diagram illustrating one of the data chips in the memory module of FIG. 1 according to example embodiments. In FIG. 4, it is assumed that each of the data chips 200a~200k in FIG. 1 employs a volatile memory device. Referring to FIG. 4, the data chip 200a may include a control logic circuit 210, an address register 220, a bank control logic circuit 230, a row address multiplexer 240, a column address latch 250, a row decoder 260, a column decoder 270, a memory cell array 300, a sense amplifier unit 285, an input/output (I/O) gating circuit 290, a data input/output (I/O) buffer 295 and a refresh counter 245. The memory cell array 300 may include first through eighth bank arrays 310, 320, 330, 340, 350, 360, 370 and 380. The row decoder 260 may include first through eighth bank row decoders 260a~260h coupled to the first through eighth bank arrays 310~380, respectively, the column decoder 270 may include first through eighth bank column decoders 270a~270h coupled to the first through eighth bank arrays 310~380, respectively, and the sense amplifier unit 285 may include first through eighth bank sense amplifiers 285a~285h coupled to the first through eighth bank arrays 310~380, respectively.

The first through eighth bank arrays 310~380, the first through eighth bank row decoders 260a~260h, the first through eighth bank column decoders 270a~270h, and the first through eighth bank sense amplifiers 285a~285h may form first through eighth banks. Each of the first through eighth bank arrays 310~380 may include a plurality of word-lines WL, a plurality of bit-lines BL, and a plurality of memory cells MC formed at intersections of the word-lines WL and the bit-lines BTL.

Although the data chip 200a is illustrated in FIG. 4 as including eight banks, the data chip 200a may include any number of banks. The address register 220 may receive the address ADDR including a bank address BANK_ADDR, a row address ROW_ADDR, and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through eighth bank row decoders 260a~260h.

The activated one of the first through eighth bank row decoders 260a~260h may decode the row address RA that is output from the row address multiplexer 240, and may activate a word-line WL corresponding to the row address RA. For example, the activated bank row decoder may generate a word-line driving voltage and may apply the word-line driving voltage to the word-line WL corresponding to the row address RA.

The column address latch 250 may receive the column address COL_ADDR from the address register 220, and may temporarily store the received column address COL_ADDR. In example embodiments of the inventive concept, in a burst mode, the column address latch 250 may generate column addresses that increment from the received column address COL_ADDR. The column address latch 250 may apply the temporarily stored or generated column address to the first through eighth bank column decoders 270a~270h.

The activated one of the first through eighth bank column decoders 270a~270h may decode the column address COL_ADDR that is output from the column address latch 250, and may control the I/O gating circuit 290 to output data corresponding to the column address COL_ADDR. The I/O gating circuit 290 may include circuitry for gating input/output data. The I/O gating circuit 290 may further include read data latches for storing data that is output from the first through eighth bank arrays 310~380, and write control devices for writing data to the first through eighth bank arrays 310~380.

Data to be read from one of the first through eighth bank arrays 310~380 may be sensed by a sense amplifier coupled to the one bank array from which the data is to be read, and may be stored in the read data latches. The data stored in the read data latches may be provided to the memory controller 100 via the data I/O buffer 295. Data set DQ_BL to be written in one of the first through eighth bank arrays 310~380 may be provided to the data I/O buffer 295 from the memory controller 100. The data I/O buffer 295 may provide the data set DQ_BL to the I/O gating circuit 290.

The control logic circuit 210 may control operations of the data chip 200a. For example, the control logic circuit 210 may generate control signals for the data chip 200a to perform the write operation or the read operation. The control logic circuit 210 may include a command decoder 211 that decodes the command CMD received from the memory controller 100 and a mode register 212 that sets an operation mode of the data chip 200a. Each of the parity chips 200pa and 200pb in FIG. 1 may have substantially the same configuration as the data chip 200a. Each of the parity chips 200pa and 200pb may input/output a corresponding parity data.

Figure 5:
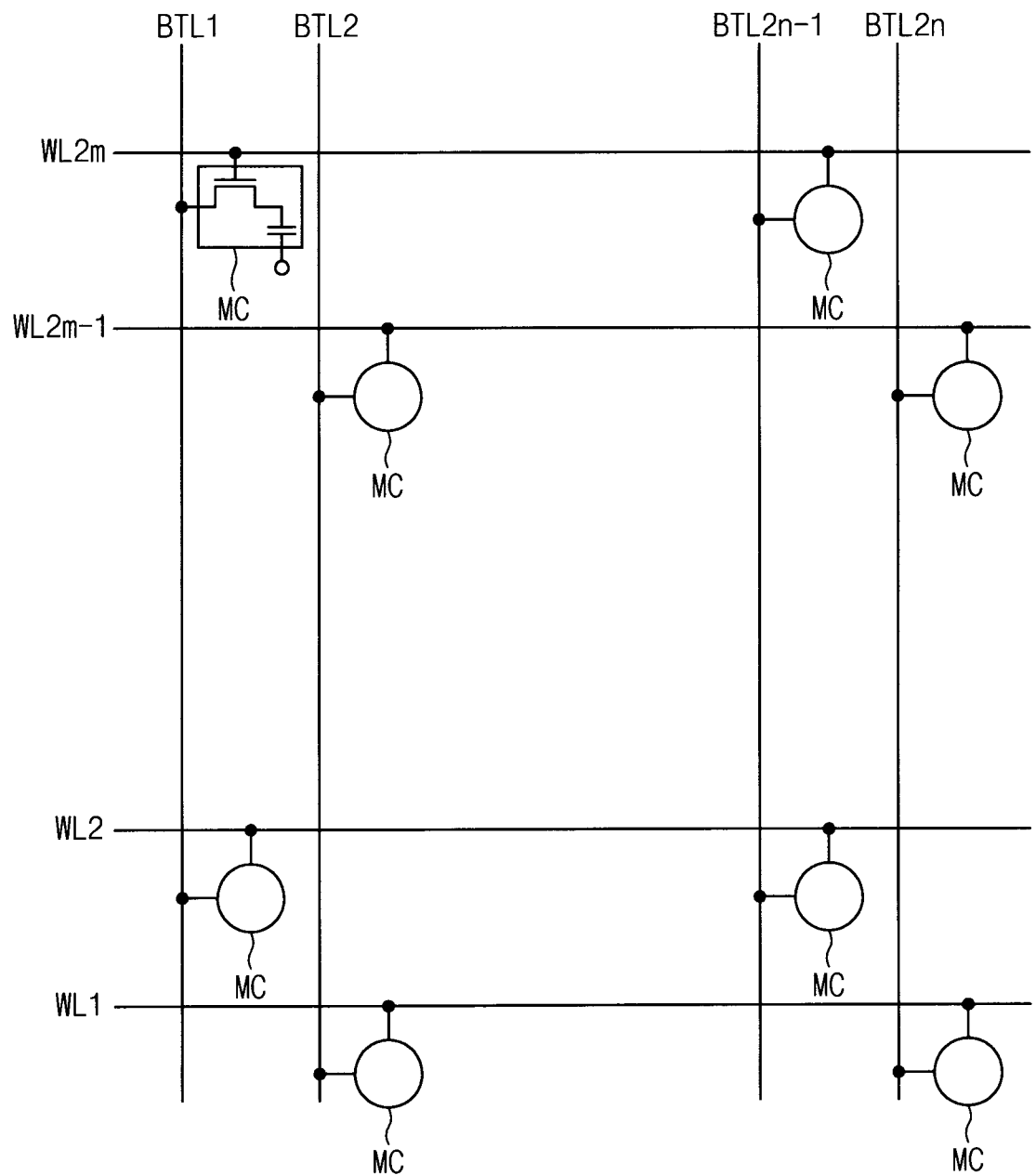
FIG. 5 illustrates a first bank array in the data chip of FIG. 4 according to example embodiments.

FIG. 5 illustrates a first bank array in the data chip of FIG. 4 according to example embodiments. Referring to FIG. 5, the first bank array 310 includes a plurality of word-lines WL1~WL2m (where m is positive integer greater than two), a plurality of bit-lines BTL1~BTL2n (where n is a positive integer greater than two), and a plurality of memory cells MCs disposed near intersections between the word-lines WL1~WL2m and the bit-lines BTL1~BTL2n. In an exemplary embodiment of the inventive concept, each of the plurality of memory cells MCs may include a DRAM cell structure. The plurality of word-lines WL1~WL2m to which the plurality of memory cells MCs are connected may be referred to as rows of the first bank array 310 and the plurality of bit-lines BL1~BL2n to which the plurality of memory cells MCs are connected may be referred to as columns of the first bank array 310.

Figure 6:
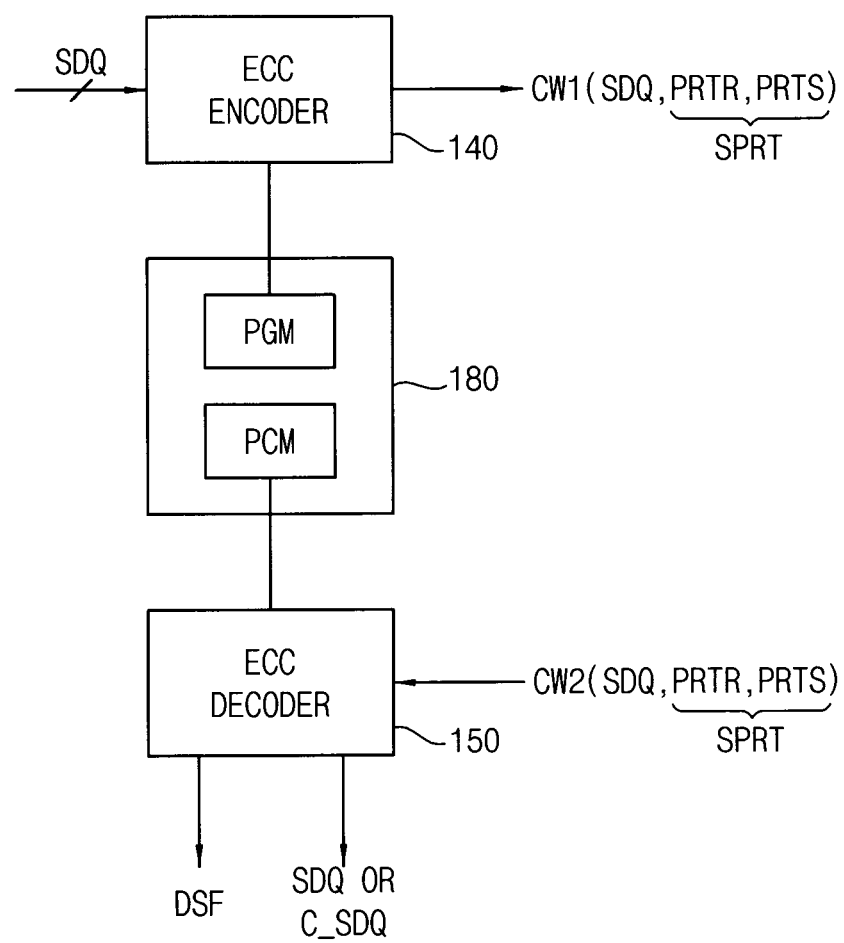
FIG. 6 is a block diagram illustrating an example of the error correction circuit in FIG. 2 according to example embodiments.

FIG. 6 is a block diagram illustrating an example of the error correction circuit in FIG. 2 according to example embodiments. Referring to FIG. 6, the error correction circuit 130 includes an ECC encoder 140, an ECC decoder 150 and a memory 180. The memory 180 may be referred to as an ECC memory 180. The memory 180 is connected to the ECC encoder 140 and the ECC decoder 150 and may store a parity generation matrix PGM and a parity check matrix PCM. The ECC encoder 140 may perform an ECC encoding on the user data set SDQ by using the parity generation matrix PCM to generate a parity data set SPRT including the first parity data PRTR and the second parity data PRTS and may output a codeword CW1 including the user data set SDQ, the first parity data PRTR and the second parity data PRTS.

The ECC decoder 150 may receive a codeword CW2 including the user data set SDQ, the first parity data PRTR and the second parity data PRTS from the memory module MM. The ECC decoder 150 may perform an ECC decoding on the codeword CW2 by using a first portion of the parity check matrix PCM to generate a decoding status flag DSF indicating the user data set SDQ includes a correctable error while outputting the user data set SDQ.

The ECC decoder 150 may perform an ECC decoding on codeword CW2 including the user data set SDQ, the first parity data PRTR and the second parity data PRTS by using the parity check matrix PCM, may operate in one of a first decoding mode and a second decoding mode according to a type of errors in user data set SDQ, may selectively correct one of the chip error and the one or more symbol errors in the user data set SDQ and may output the user data set SDQ or the corrected user data set C_SDQ.

Figure 7:
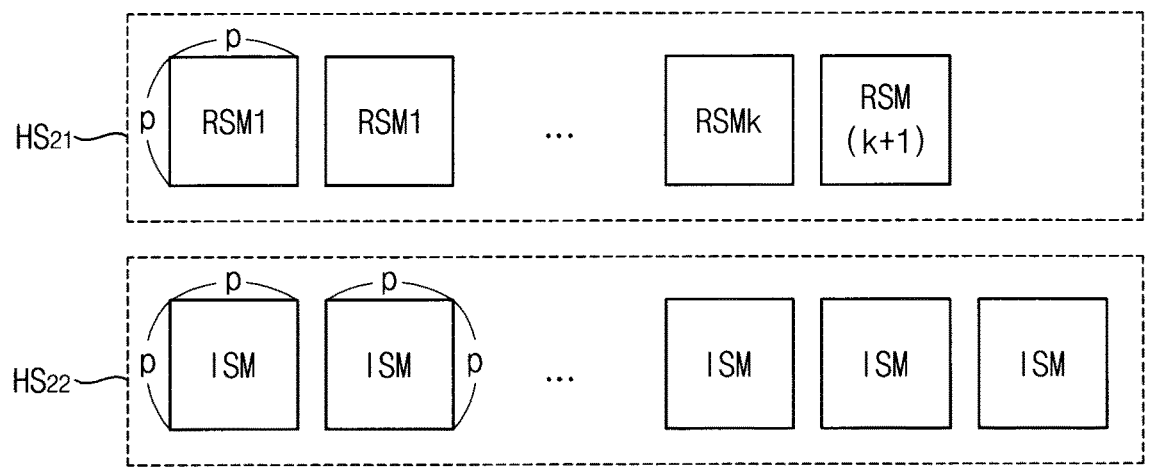
FIG. 7 illustrates a parity generation matrix stored in the memory in the error correction circuit of FIG. 6.

FIG. 7 illustrates a parity generation matrix stored in the memory in the error correction circuit of FIG. 6. The parity generating matrix PGM may have a similar configuration with the parity check matrix PCM. Referring to FIG. 7, the parity check matrix PCM may include a first check matrix $HS_{21}$, and a second check matrix $HS_{22}$. The first check matrix $HS_{21}$ may be generated based on Reed-Solomon code and may be used for generating the first syndrome. The second check matrix $HS_{22}$ may be generated based on a simple parity check code and may be used for generating the second syndrome.

The first check matrix $HS_{21}$ includes a plurality of Galois field sub matrixes RSM1~RSM(k+1) therein, which correspond to the data chips 200a~200k and the first parity chip 200pa, and each of the plurality of Galois field sub matrixes RSM1~RSM(k+1) have p×p elements. Here, p is an integer greater than three. The second check matrix $HS_{22}$ includes (k+2) unit sub matrixes ISM corresponding to the data chips 200a~200k, the first parity chip 200pa and the second parity chip 200pb, and each of the unit sub matrixes ISM have p×p elements.

Figure 8:
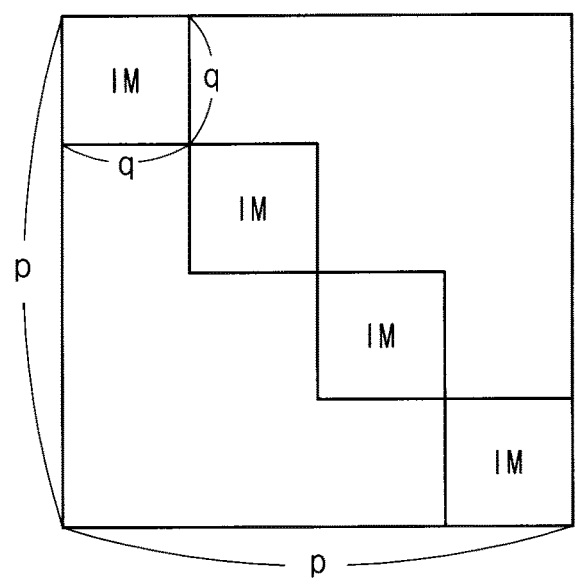
FIG. 8 illustrates a unit sub matrix constituting the second check matrix in FIG. 7.

FIG. 8 illustrates a unit sub matrix constituting the second check matrix in FIG. 7. Referring to FIG. 8, the unit sub matrix ISM includes p/q unit matrixes IM arranged in a diagonal direction. Here, q is an integer greater than one and smaller than p. Each of the unit sub matrix ISM has q×q elements. In the second check matrix $HS_{22}$, other elements except the unit matrixes IM have '0' value.

FIG. 9 illustrates a unit matrix in FIG. 8. Referring to FIG. 9, q elements in a diagonal direction have a logic high level and other elements except the q elements in a diagonal direction have a logic low level (i.e., '0' value).

FIG. 10 illustrates a portion of the Galois field sub matrixes in FIG. 7. Referring to FIG. 10, a Galois field sub matrix RSM1 includes unit matrixes IM and α matrixes $\alpha^s$, $\alpha^{2s}$ and $\alpha^{3s}$. Here, s is an integer in a range from 1 through 4. A Galois field sub matrix RSM(k+1) includes a matrixes $\alpha^{(4k-4)\times s}$, $\alpha^{(4k-3)\times 2s}$, $\alpha^{(4k-2)\times 2s}$ and $\alpha^{(4k-1)\times 4s}$. Here, the α matrix may be obtained using q-order primitive polynomial. $\alpha^2$ may be obtained by involution of α. The α matrixes $\alpha^{(4k-1)\times 4s}$ may be obtained by involution of a by (4k−1)×4s times. Elements of the α matrixes may belong to Galois field.

Figure 11:
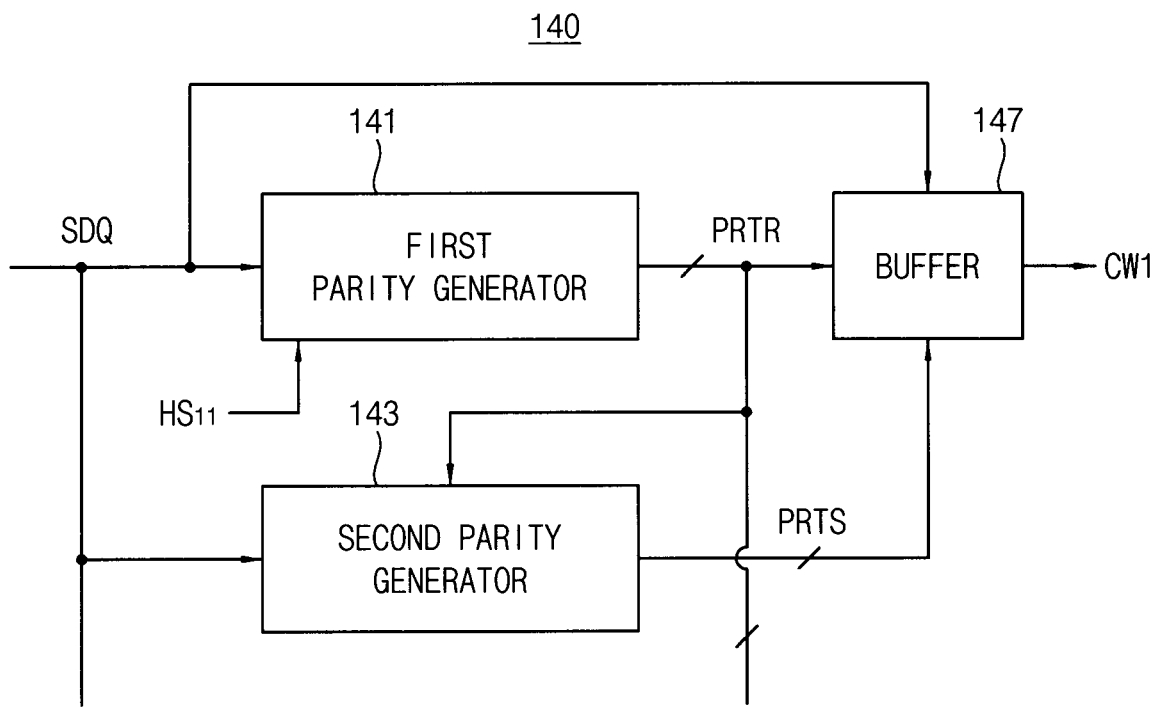
FIG. 11 illustrates an example of the ECC encoder in the error correction circuit of FIG. 6 according to example embodiments.

FIG. 11 illustrates an example of the ECC encoder in the error correction circuit of FIG. 6 according to example embodiments. Referring to FIG. 11, the ECC encoder 140 includes first parity generator 141, a second parity generator 143 and a buffer 147.

The first parity generator 141 performs an ECC encoding on the user data set SDQ by symbol basis using the first generation matrix $HS_{11}$ to generate the first parity data PRTR provides the first parity data PRTR to the buffer 147. The first parity generator 141 may generate the first parity data PRTR by performing a matrix-multiplication operation on the user data set SDQ and the first generation matrix $HS_{11}$.

The second parity generator 143 performs a simple parity check on the user data set SDQ and the first parity data PRTR by data bits (cell index) basis using the second generation sub matrix $HS_{12}$ to generate the second parity data PRTS and provides the second parity data PRTS to the buffer 147. The simple parity check is a code to make sum of data bits by cell basis to an even or odd number. The buffer 147 receives the user data set SDQ, the first parity data PRTR and the second parity data PRTS and provides the memory module MM with the codeword CW1 including the user data set SDQ, the first parity data PRTR and the second parity data PRTS.

Figure 12:
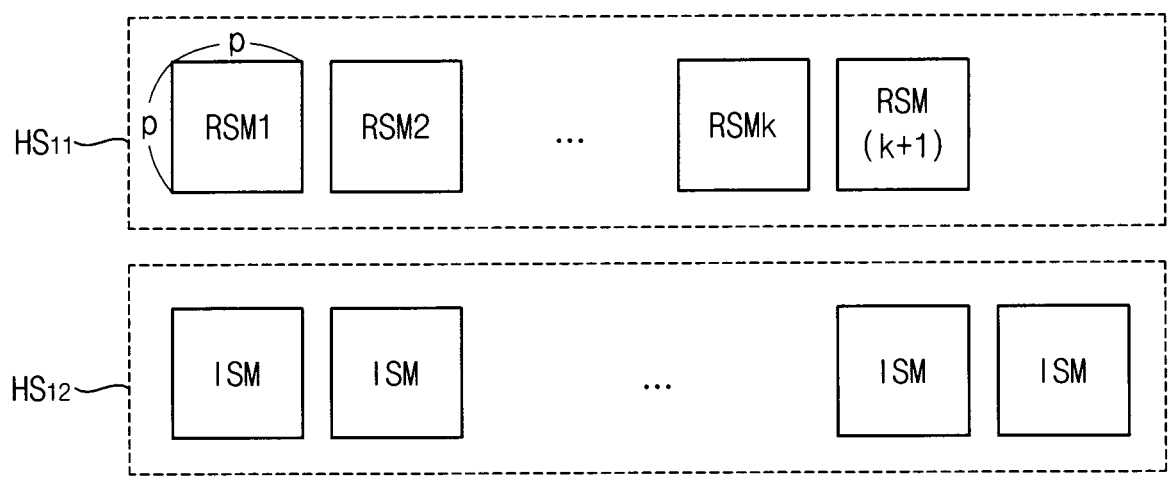
FIG. 12 illustrates a parity generation matrix stored in the memory in the error correction circuit of FIG. 6.

FIG. 12 illustrates a parity generation matrix stored in the memory in the error correction circuit of FIG. 6. Referring to FIG. 12, the parity generation matrix PGM may include a first generation matrix $HS_{11}$ and a second generation matrix $HS_{12}$. The first generation matrix $HS_{11}$ a plurality of Galois field sub matrixes RSM1~RSM(k+1) corresponding to the data chips 200a~200k and the first parity chip 200pa, and each of the plurality of Galois field sub matrixes RSM1~RSM(k+1) have p×p elements. The first generation matrix $HS_{11}$ may be generated based on Reed-Solomon code and may be used for generating the parity data PRTR.

The second generation matrix $HS_{12}$ includes (k+2) unit sub matrixes ISM corresponding to the data chips 200a~200k, the first parity chip 200pa and the second parity chip 200pb, and each of the unit sub matrixes ISM have p×p elements. The second generation matrix $HS_{12}$ may be generated based on a simple parity check code and may be used for generating the second parity data PRTS.

Figure 13:
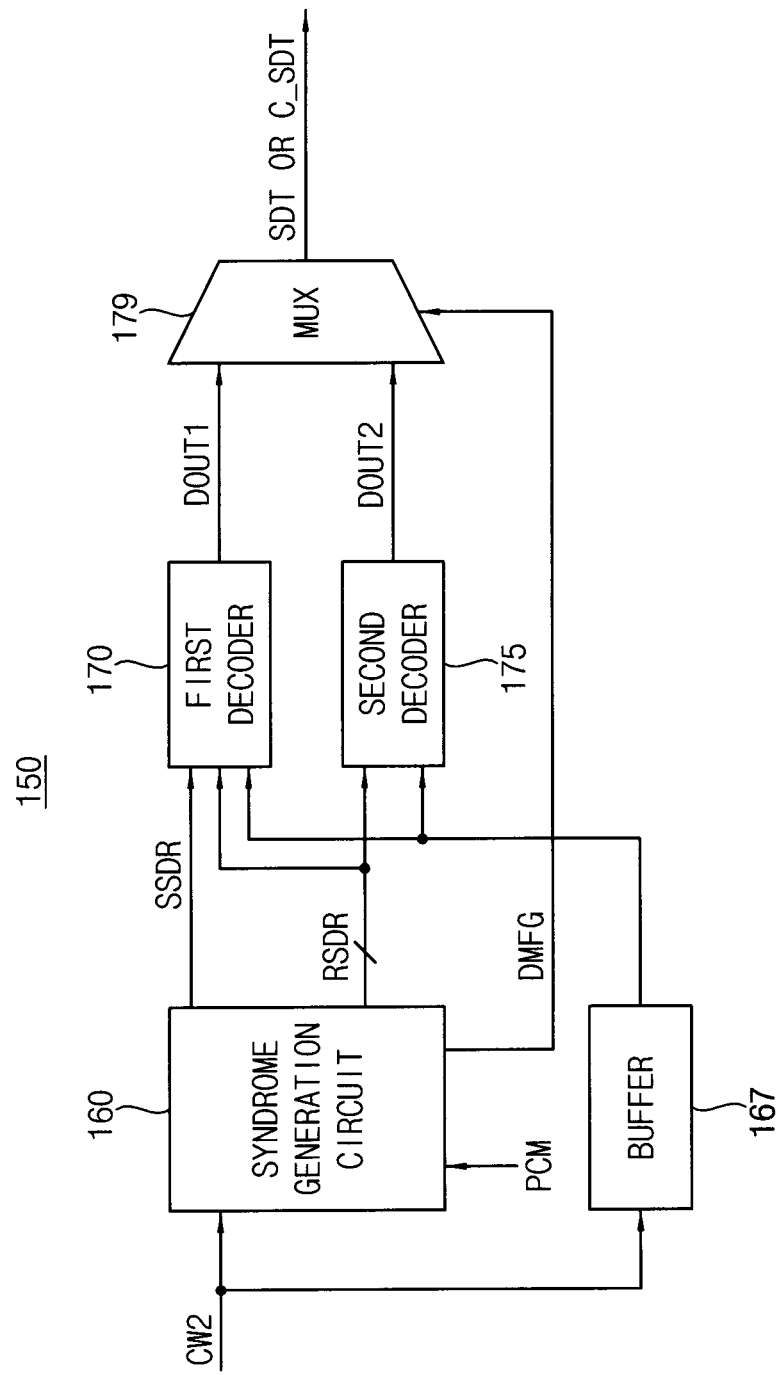
FIG. 13 illustrates an example of the ECC decoder in the error correction circuit of FIG. 6 according to example embodiments.

FIG. 13 illustrates an example of the ECC decoder in the error correction circuit of FIG. 6 according to example embodiments. Referring to FIG. 13, the ECC decoder 150 includes a syndrome generation circuit 160, a first decode 170, a second decoder 175 and a selection circuit (MUX) 179. The ECC decoder 150 may further include a buffer 167. The buffer 167 receives the codeword CW2 and provides the codeword CW2 to the first decoder 170 and the second decoder 175.

The syndrome generation circuit 160 may generate a first syndrome RSDR based on the codeword CW2 using a first check matrix of the parity check matrix PCM, may generate a second syndrome SSDR based on the codeword CW2 using a second check matrix of the parity check matrix PCM, and may generate a decoding mode flag DMFG based on the first syndrome RSDR and the second syndrome SSDR. The syndrome generation circuit 160 may provide the first syndrome RSDR and the second syndrome SSDR to the first decoder 170 and the second decoder 175 and may provide the decoding mode flag DMFG to the selection circuit 179.

The first decoder 170 may correct the chip error in the codeword CW2 based on the first syndrome RSDR and the second syndrome SSDR to provide a first output data set DOUT1. The first decoder 170 may correspond to a chip-kill decoder that performs a chip-kill. The second decoder 175 may correct the one or more symbol errors in the codeword CW2 based on the first syndrome RSDR to provide a second output data set DOUT2. The second decoder 175 may correspond to a Reed-Solomon decoder that performs a Reed-Solomon decoding. The selection circuit 179, in response to the decoding mode flag DMFG, may provide the second output data set DOUT2 as the user data set SDT or the corrected user data set C_SDT in the first decoding mode or may provide the first output data set DOUT1 as the user data set SDT or the corrected user data set C_SDT in the second decoding mode.

Figure 14A:
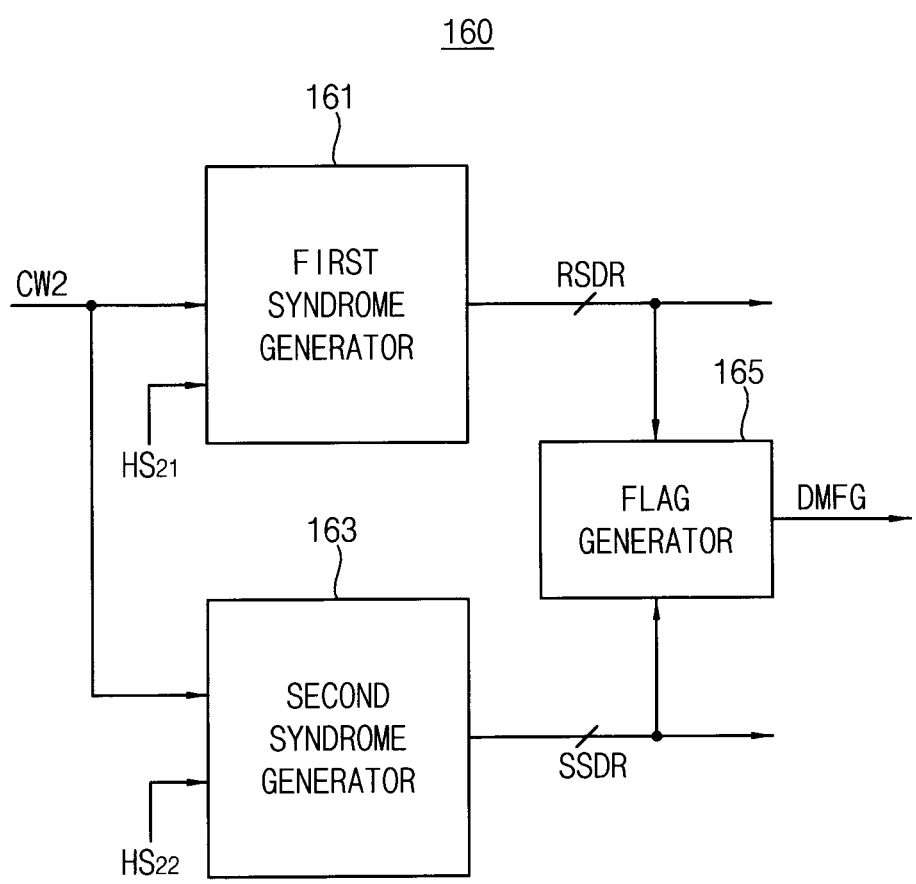
FIG. 14A illustrates an example of the syndrome generation circuit in the ECC decoder of FIG. 13 according to example embodiments.

FIG. 14A illustrates an example of the syndrome generation circuit in the ECC decoder of FIG. 13 according to example embodiments. Referring to FIG. 14A, the syndrome generation circuit 160 may include a first syndrome generator 161, a second syndrome generator 163 and a flag generator 165. The first syndrome generator 161 may generate the first syndrome RSDR by performing a matrix-multiplication operation on the codeword CW2 and the first check matrix $HS_{21}$. The second syndrome generator 163 may generate the second syndrome SSDR by performing a matrix-multiplication operation on the codeword CW2 and the second check matrix $HS_{22}$. The flag generator 165 may generate the decoding mode flag DMFG indicating the type of errors in the codeword CW2 based on the first syndrome RSDR and the second syndrome SSDR. The flag generator 165 may determine a logic level of the decoding mode flag DMFG according to the type of errors in the codeword CW2. For example, the flag generator 165 may output the decoding mode flag DMFG with a first logic level designating the first decoding mode, in response to the type of errors in the codeword CW2 corresponding to one or two symbol errors. For example, the flag generator 165 may output the decoding mode flag DMFG with a second logic level designating the second decoding mode, in response to the type of errors in the codeword CW2 corresponding to three or more two symbol errors.

Figure 14B:
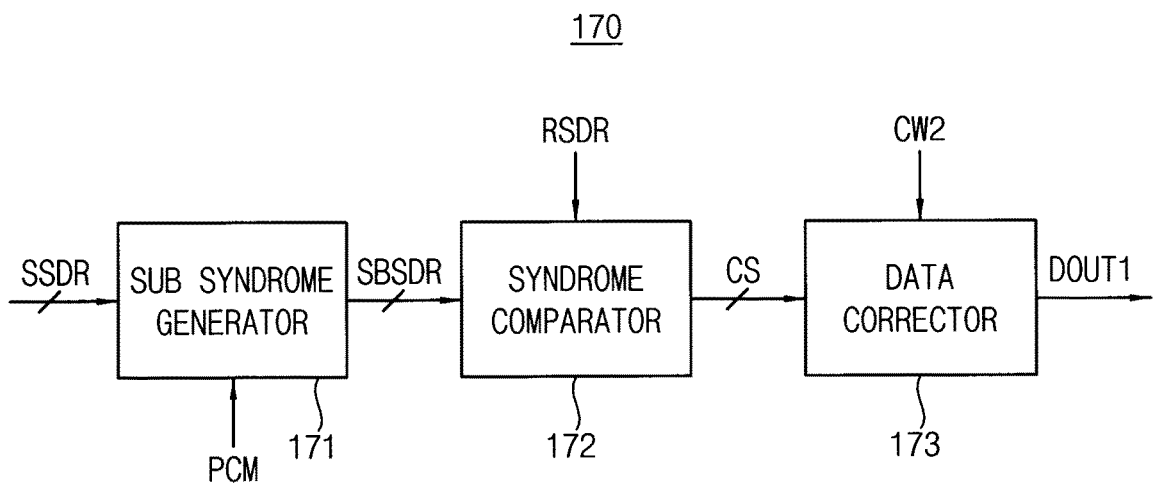
FIG. 14B illustrates an example of the first decoder in the ECC decoder of FIG. 13 according to example embodiments.

FIG. 14B illustrates an example of the first decoder in the ECC decoder of FIG. 13 according to example embodiments. Referring to FIG. 14B, the first decoder 170 may include a sub syndrome generator 171, a syndrome comparator 172 and a data corrector 173. The sub syndrome generator 171 may generate a plurality of sub syndromes SBSDR corresponding to respective one of the plurality of data chips based on the second syndrome SSDR and the parity check PCM. The sub syndrome generator 171 may generate the plurality of sub syndromes SBSDR by applying the second syndrome SSDR to the parity check PCM.

The syndrome comparator 172 may compare the first syndrome RSDR with the sub syndromes SBSDR corresponding to respective one of the plurality of data chips and may provide the data corrector 173 with comparison signal CS indicating a result of the comparison. The data corrector 173 receives the codeword CW2 and corrects three or more symbol errors (chip error) occurring in a data chip and outputs the first output data set DOUT1. Therefore, the first decoder 170 may determine a data chip in which the chip error occurs, among the plurality of data chips, based on comparison of the sub syndromes SBSDR and the first syndrome RSDR.

Figure 14C:
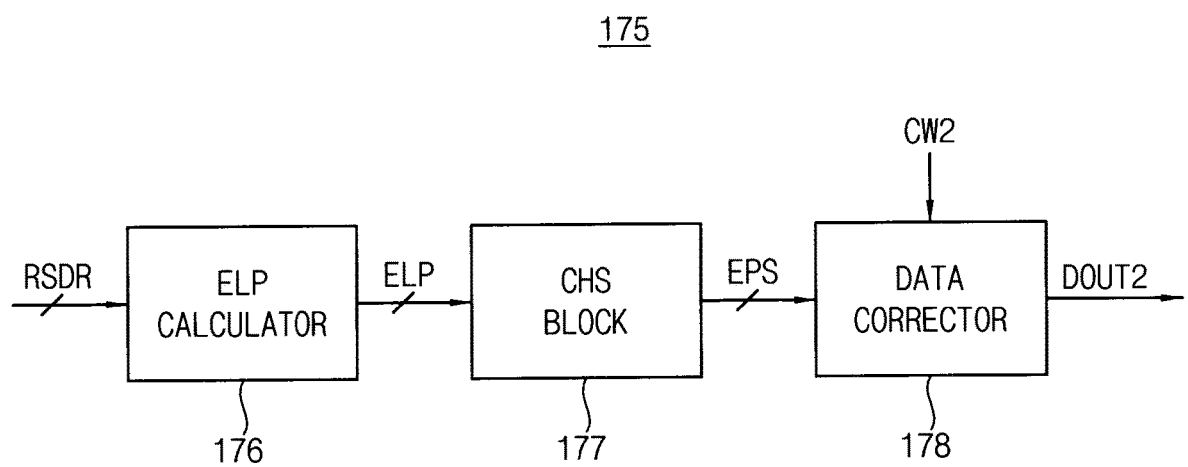
FIG. 14C illustrates an example of the second decoder in the ECC decoder of FIG. 13 according to example embodiments.

FIG. 14C illustrates an example of the second decoder in the ECC decoder of FIG. 13 according to example embodiments. Referring to FIG. 14C, the second decoder 175 may include an error locator polynomial (ELP) calculator 176, a Chien search (CHD) block 177 and a data corrector 178. The ELP calculator 176 may calculate error locator coefficients ELP, coefficients of the error locator polynomial based on the first syndrome RSDR and the second syndrome SSDR and may provide the error locator coefficients ELP to the Chien search block 177.

The Chien search block 177 may search error locations based on the error locator coefficients ELP and may provide the data corrector 178 with an error position signal EPS indicating the searched error locations. The data corrector 178 receives the codeword CW2, corrects one symbol error or two symbol errors based on the error position signal EPS and outputs the second output data set DOUT2.

Figure 15:
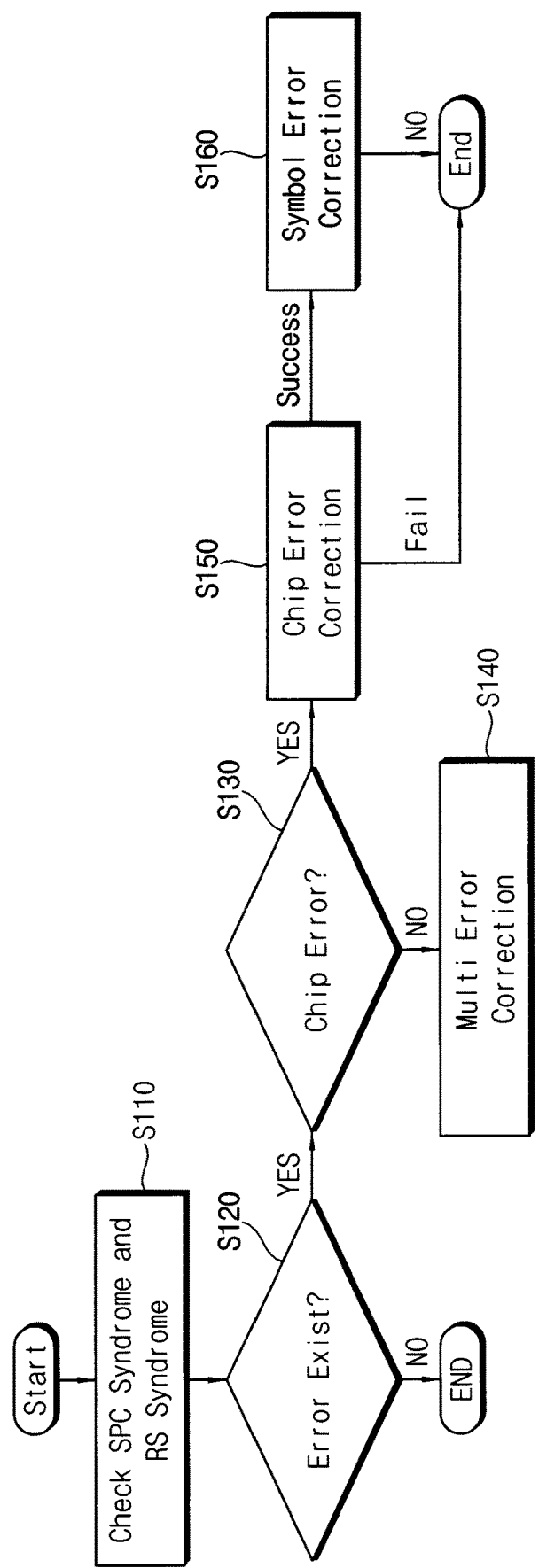
FIG. 15 illustrates an operation of the ECC decoder of FIG. 13 according to example embodiments.

FIG. 15 illustrates an operation of the ECC decoder of FIG. 13 according to example embodiments. Referring to FIGS. 13 through 15, the first decoder 170 and the second decoder 175 check the first syndrome (RS syndrome) RSDR and the second syndrome (SPC syndrome) SSDR (operation S110). The first decoder 170 and the second decoder 175 determine whether errors are included in the codeword CW2 based on a result of checking the first syndrome RSDR and the second syndrome SSDR (operation S120).

When the codeword CW2 does not include errors (No in operation S120), the ECC decoder 150 outputs the user data set SDT. When the codeword CW2 includes errors (Yes in operation S120), the first decoder 170 and the second decoder 175 determines whether a chip error occurs by checking the first syndrome RSDR and the second syndrome SSDR (operation S130). When the chip error does not occur (No in operation S130), the second decoder 175 corrects multi errors in symbols in multiple data chips to output the corrected user data set C_SDQ (operation S140).

When the chip error occurs (Yes in operation S130), the first decoder 170 corrects symbol errors in one data chip (operation S150). If the first decoder 170 fails to correct symbol errors in one data chip (Fail in operation S150), the ECC decoder 150 may output, to the CPU 110, the flag signal DSF indicating that the symbol errors are not corrected. If the first decoder 170 corrects the symbol errors in one data chip (Success in operation S150), the ECC decoder 150 corrects a symbol error associated with another data chip (operation S160) and provides the flag signal DSF to the CPU 110.

FIGS. 16A through 18 illustrate various types of errors which the ECC decoder may correct according to example embodiments. In FIGS. 16A through 18, it is assumed that chips CHIP1~CHIP8 correspond to the data chip 200a~200k in FIG. 3, each of the chips CHIP1~CHIP8 outputs respective one of user data DQ_BL1~DQ_BL8, the first parity chip 200pa outputs the first parity data PRTR and the second parity chip 200pb outputs the second parity data PRTS. In addition, in FIGS. 16A through 18, X denotes a symbol error which occurs in data by symbol basis.

Figure 16A:
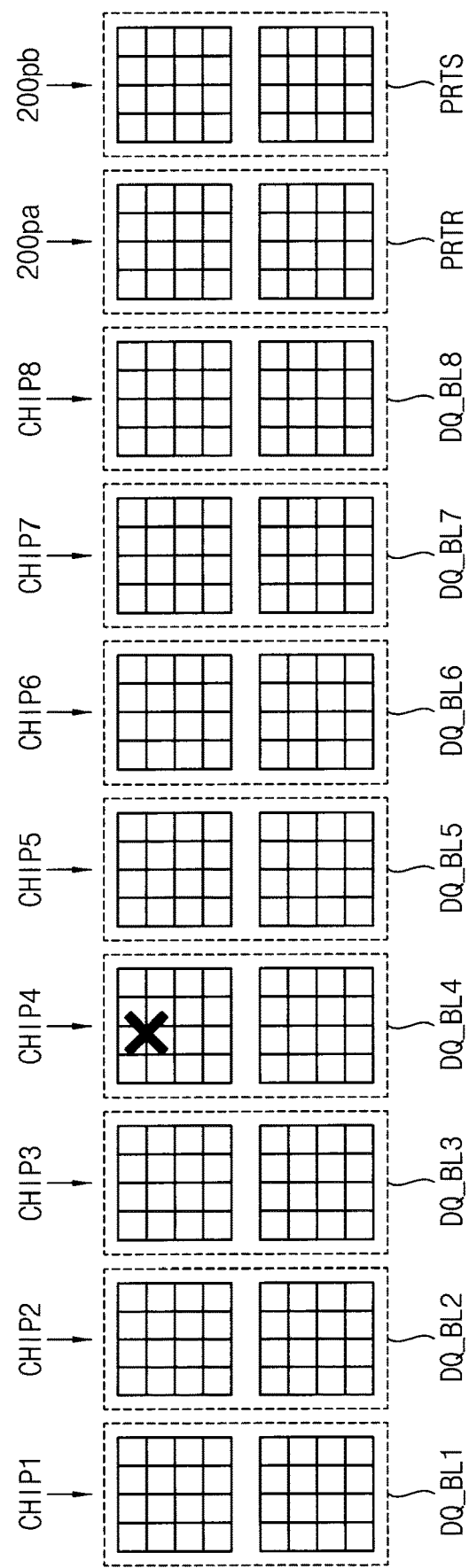
FIGS. 16A through 18 illustrate various types of errors which the ECC decoder may correct according to example embodiments.
Figure 16B:
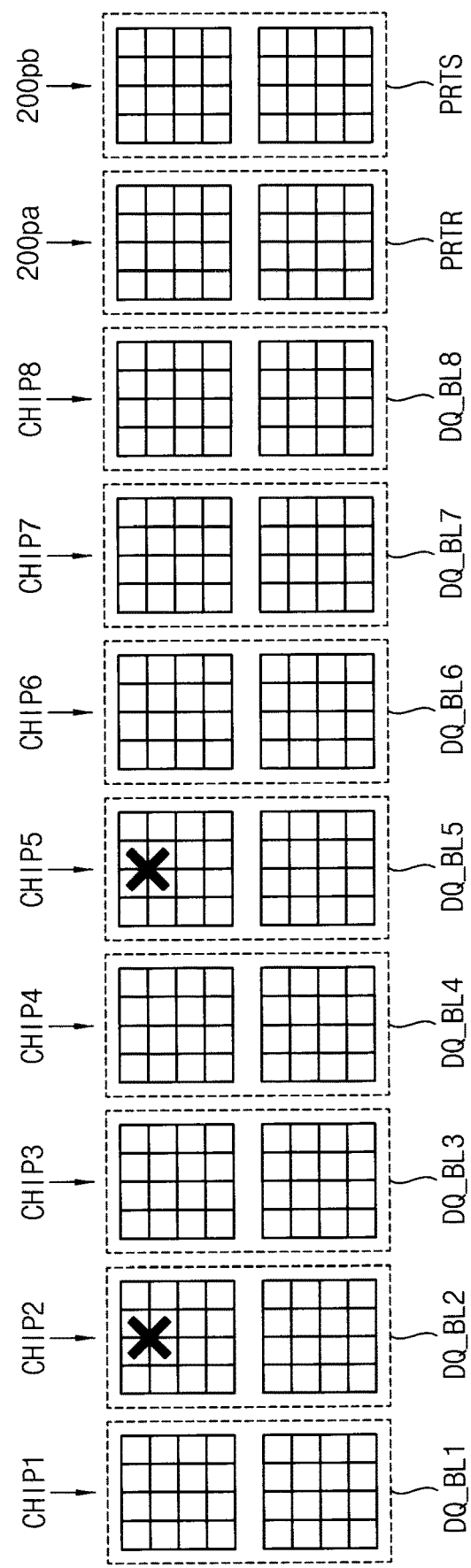

Referring to FIG. 16A, when the user data DQ_BL output from the chip CHIP4 includes the symbol error X, the second syndrome SSDR indicates one symbol error and the first syndrome RSDR has non-zero value. Therefore, the second decoder 175 may correct one symbol error in a first decoding mode. Referring to FIG. 16B, when the user data DQ_BL output from the chips CHIP2 and CHIP4 include the symbol errors X having a same pattern, the second syndrome SSDR indicates two symbol errors and the first syndrome RSDR has non-zero value. Therefore, the second decoder 175 may correct two symbol errors in the first decoding mode.

Figure 16C:
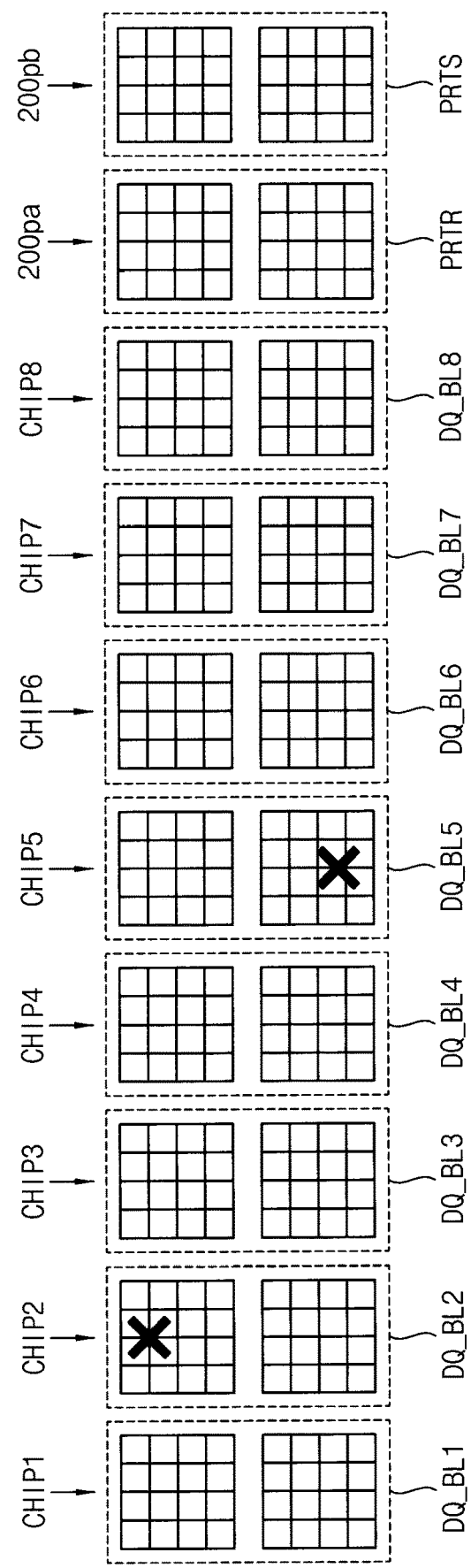
Figure 16D:
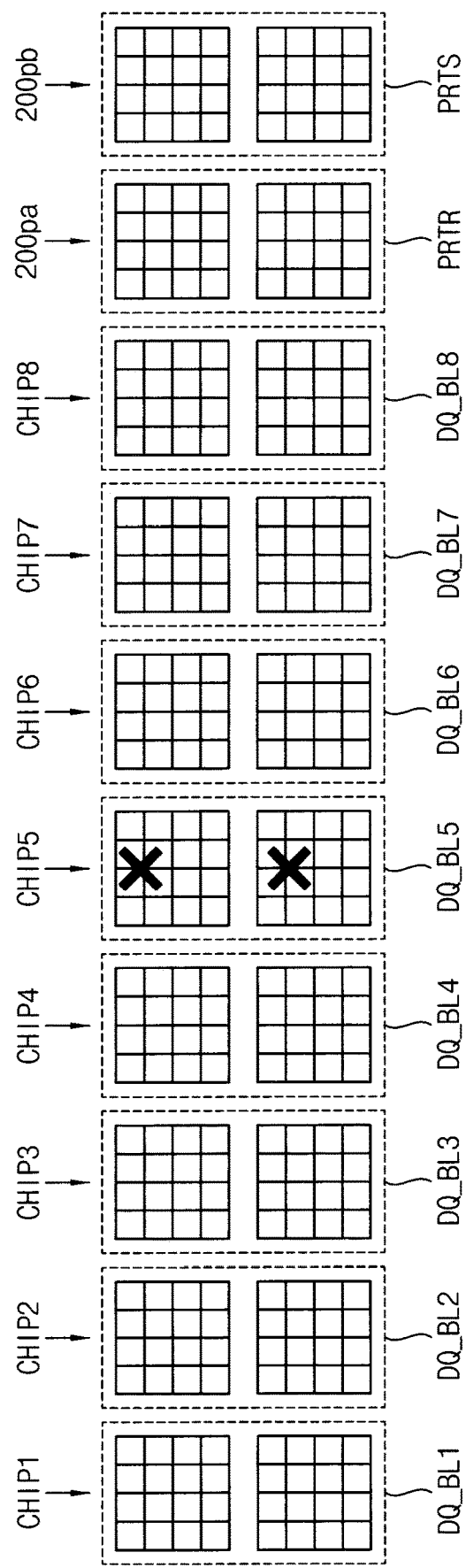

Referring to FIG. 16C, when the user data DQ_BL output from the chips CHIP2 and CHIP4 include the symbol errors X having random patterns, the second syndrome SSDR indicates two symbol errors and the first syndrome RSDR has non-zero value. Therefore, the second decoder 175 may correct two symbol errors in the first decoding mode. Referring to FIG. 16D, when the user data DQ_BL output from the chip CHIP5 includes two symbol errors X having random patterns, the second syndrome SSDR indicates two symbol errors and the first syndrome RSDR has non-zero value. Therefore, the second decoder 175 may correct two symbol errors in the first decoding mode.

Figure 17:
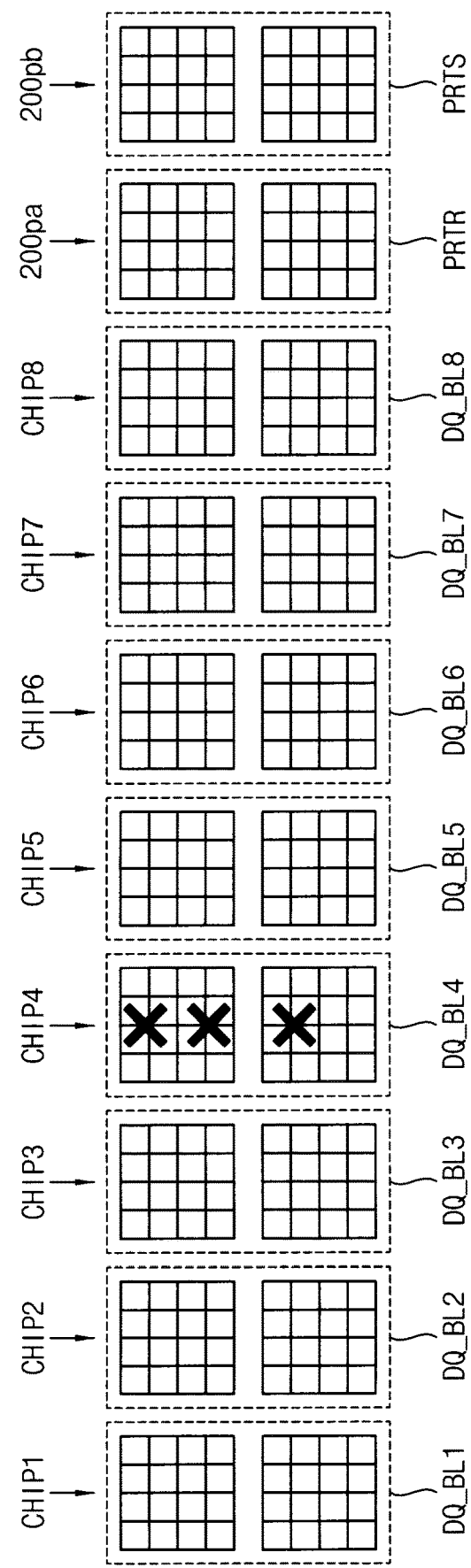

Referring to FIG. 17, when the user data DQ_BL output from the chip CHIP4 includes three symbol errors X, the second syndrome SSDR indicates three symbol errors and the first syndrome RSDR has non-zero value. Therefore, the first decoder 170 may correct thee symbol errors in the user data from one data chip in the second decoding mode.

Figure 18:
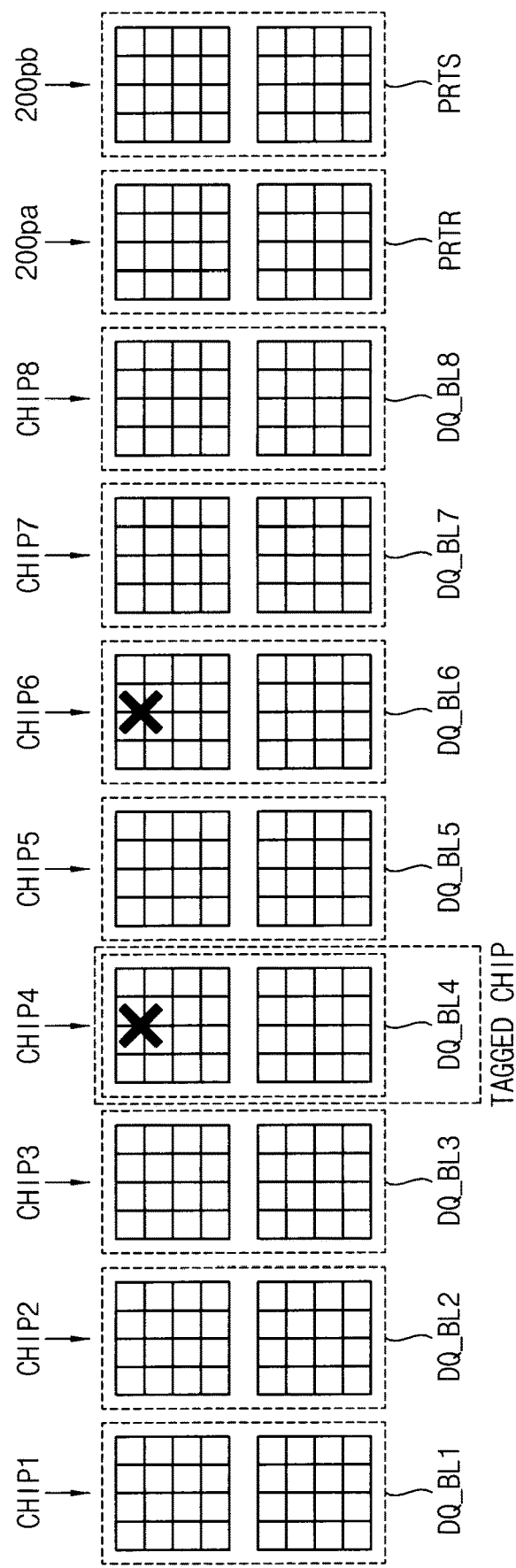

Referring to FIG. 18, when the user data DQ_BL output from the chip CHIP6 includes one symbol X after the three symbol errors included in the user data DQ_BL output from the chip CHIP4 are corrected, the first decoder 170 may correct one symbol error additionally in the first decoding mode. The ECC decoder 150 may mark the chip CHIP4 as a tagged chip after the three symbols are corrected.

FIG. 19 is a table illustrating various types of errors which the ECC decoder determines based on the first syndrome and the second syndrome. Referring to FIG. 19, when symbol errors having a same pattern occur in two chips, the second syndrome has a non-zero value and the first syndrome RSDR has a zero value. When one symbol error occurs in one chip or two symbol errors having random patterns occur in two chips, the second syndrome SSDR indicates one symbol error or two symbol errors and the first syndrome RSDR has a zero value.

Figure 20:
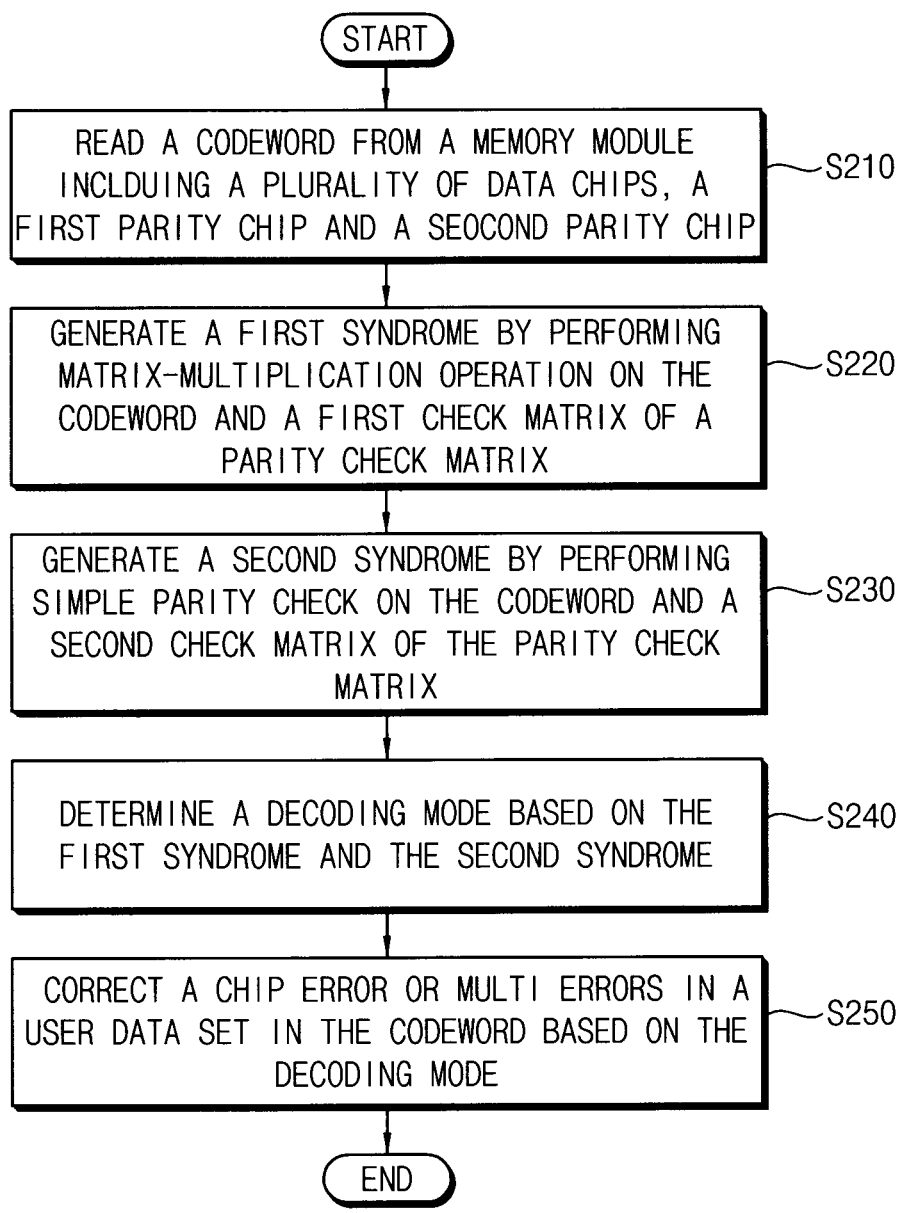
FIG. 20 is a flow chart illustrating a method of correcting errors in a memory controller according to example embodiments.

When three or four symbol errors occur in one chip, the second syndrome SSDR indicates three or four symbol errors and the first syndrome RSDR has a zero value. When one or two symbol errors occur, the ECC decoder 150 may operate in the first decoding mode, When three or four symbol errors occur in one chip, the ECC decoder 150 may operate in the second decoding mode FIG. 20 is a flow chart illustrating a method of correcting errors in a memory controller according to example embodiments. Referring to FIGS. 1 through 20, there is provided a method of correcting errors in a memory controller 100. According to the method, the memory controller 100 reads a codeword CW2 including a user data set and a parity data set from a memory module MM including a plurality of data chips, a first parity chip and a second parity chip (operation S210).

An ECC decoder 150 of an error correction circuit 130 in the memory controller 100 generates a first syndrome RSDR by performing a matrix-multiplication operation on the read codeword CW2 and a first check matrix $HS_{21}$ of parity check matrix PCM (operation S220). The ECC decoder 150 generates a second syndrome SSDR by performing a matrix-multiplication operation on the read codeword CW2 and a second check matrix $HS_{22}$ of parity check matrix PCM (operation S230).

The ECC decoder 150 determines a type of errors of the user data set in the codeword CW2 and a decoding mode based on the first syndrome RSDR and the second syndrome SSDR (operation S240). The ECC decoder 150 selectively corrects one of a chip error and one or more symbol errors in the read codeword CW2 based on the decoding mode (operation S250).

Figure 21:
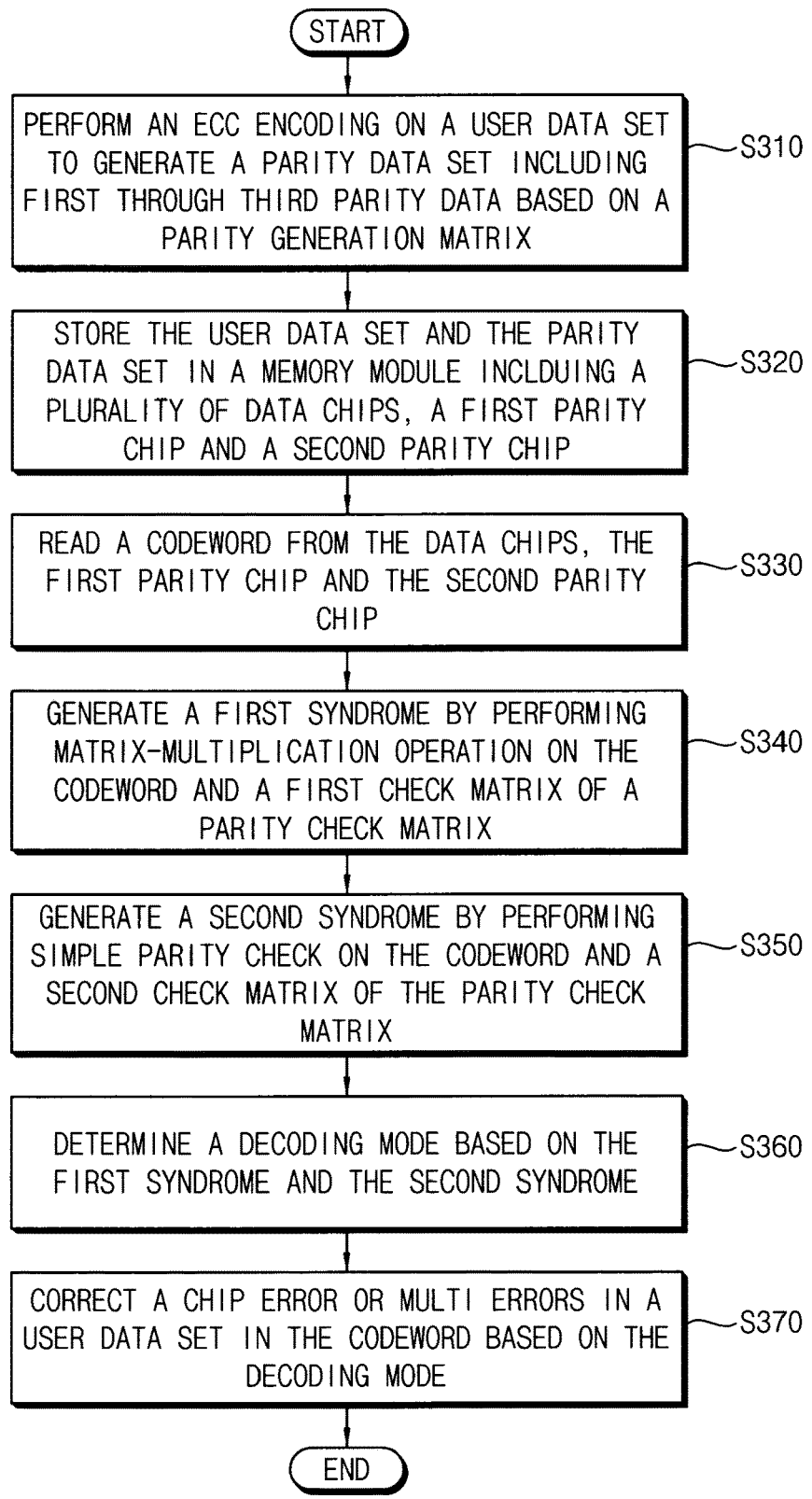
FIG. 21 is a flow chart illustrating a method of operating a memory system including a memory module and a memory controller to control the memory module according to example embodiments.

FIG. 21 is a flow chart illustrating a method of operating a memory system including a memory module and a memory controller to control the memory module according to example embodiments. Referring to FIGS. 1 through 18, and 21, there is provided a method of operating a memory system 20 that includes a memory module MM including a plurality of data chips, a first parity chip and a second parity chip and a memory controller 100 that controls the memory module MM. According to the method, an ECC encoder 140 of an error correction circuit 130 in the memory controller 100 preforms an ECC encoding on a user data set based on a parity generation matrix to generate a parity data set including a first parity data and a second parity data (operation S310).

The memory controller 100 stores a codeword CW1 including the user data set, and the parity data set in the plurality of data chips, the first parity chip and the second parity chip (operation S320). The memory controller 100 reads a codeword CW2 including the user data set and the parity data set from the plurality of data chips, the first parity chip and the second parity chip (operation S330). An ECC decoder 150 of the error correction circuit 130 generates a first syndrome RSDR by performing a matrix-multiplication operation on the read codeword CW2 and a first check matrix $HS_{21}$ of parity check matrix PCM (operation S340).

The ECC decoder 150 a second syndrome SSDR by performing a matrix-multiplication operation on the read codeword CW2 and a second check matrix $HS_{22}$ of parity check matrix PCM (operation S350). The ECC decoder 150 determines a type of errors of the user data set in the codeword CW2 and a decoding mode based on the first syndrome RSDR and the second syndrome SSDR (operation S360). The ECC decoder 150 selectively corrects one of a chip error and one or more symbol errors in the read codeword CW2 based on the decoding mode (operation S370).

Figure 22:
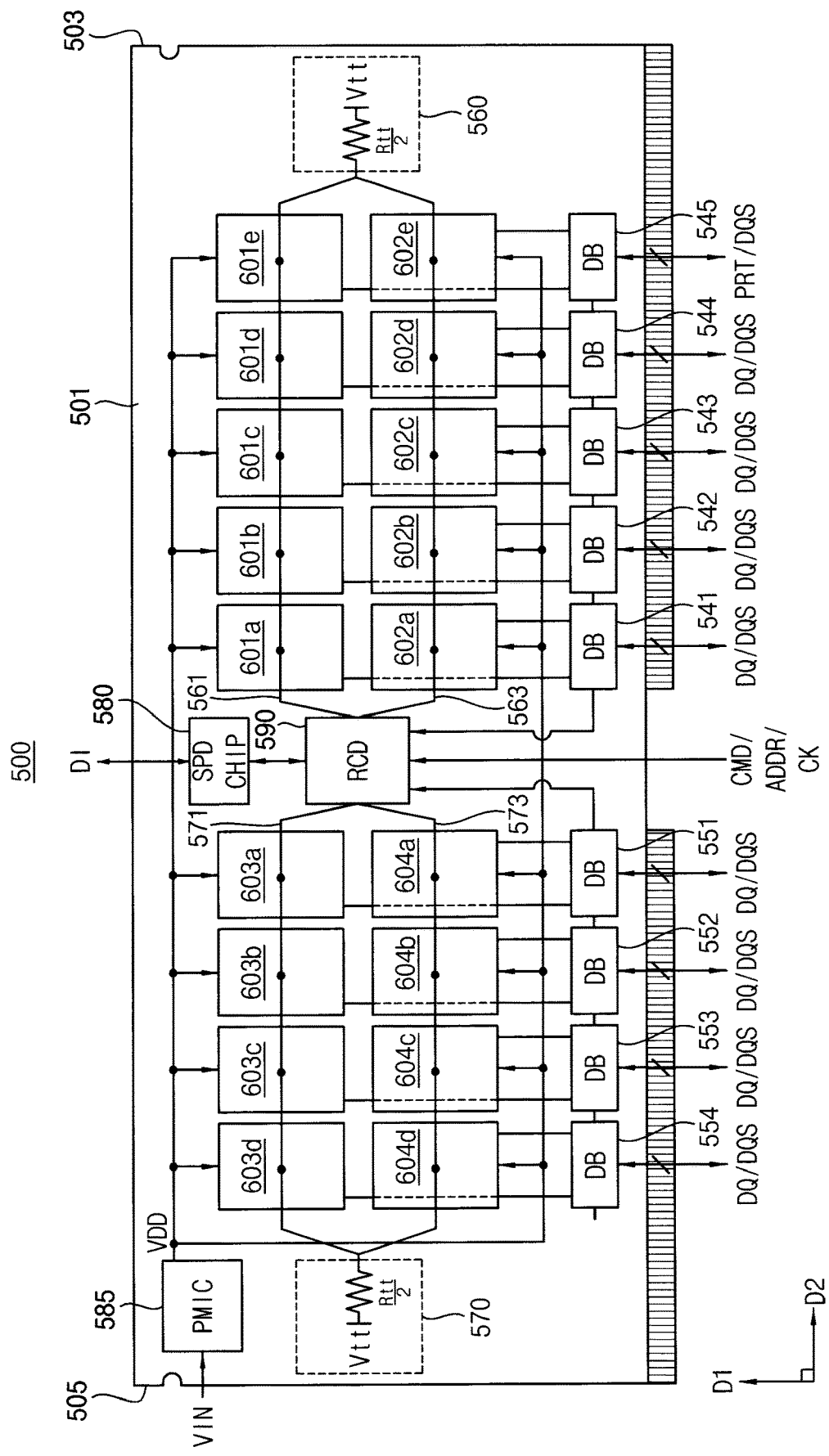
FIG. 22 is a block diagram illustrating a memory module that may be employed by the memory system according to example embodiments.

FIG. 22 is a block diagram illustrating a memory module that may be employed by the memory system according to example embodiments. Referring to FIG. 22, a memory module 500 includes the control device 590 (RCD, registered clock driver) disposed in or mounted on a circuit board 501, a plurality of semiconductor memory devices 601a~601e, 602a~602e, 603a~603d, and 604a~604d, a plurality of data buffers 541~545 and 551~555, module resistance units 560 and 570, the serial present detect (SPD) chip 580, and the PMIC 585.

The control device 590 may control the semiconductor memory devices 601a~601e, 602a~602e, 603a~603d, and 604a~604d and the PMIC 585 under control of the memory controller 100. For example, the control device 590 may receive an address ADDR, a command CMD, and a clock signal CK from the memory controller 100. The SPD chip 580 may be a programmable read only memory (e.g., EEPROM). The SPD chip 580 may include initial information or device information DI of the memory module 100. In example embodiments, the SPD chip 580 may include the initial information or the device information DI such as a module form, a module configuration, a storage capacity, a module type, an execution environment, or the like of the memory module 500.

When a memory system including the memory module 500 is booted up, the memory controller 100 may read the device information DI from the SPD chip 580 and may recognize the memory module 500 based on the device information DI. The memory controller 100 may control the memory module 500 based on the device information DI from the SPD chip 580. For example, the memory controller 100 may recognize a type of the semiconductor memory devices included in the memory module 500 based on the device information DI from the SPD chip 580.

Here, the circuit board 501 which is a printed circuit board may extend in a second direction D2, perpendicular to a first direction D1, between a first edge portion 503 and a second edge portion 505. The first edge portion 503 and the second edge portion 105 may extend in the first direction D1.

The control device 590 may be disposed on a center of the circuit board 501. The plurality of semiconductor memory devices 601a~601e, 602a~602e, 603a~603d, and 604a~604d may be arranged in a plurality of rows between the control device 590 and the first edge portion 503 and between the control device 590 and the second edge portion 505. In this case, the semiconductor memory devices 601a~601e and 602a~602e may be arranged along a plurality of rows between the control device 590 and the first edge portion 503. The semiconductor memory devices 603a~603d, and 604a~604d may be arranged along a plurality of rows between the control device 590 and the second edge portion 505. The semiconductor memory devices 601a~601d, 602a~602d, 603a~603d, and 604a~604d may be referred to data chip and the semiconductor memory devices 601e and 602e may be referred to as first and second parity chips respectively. Each of the plurality of semiconductor memory devices 601a~601e, 602a~602e, 603a~603d, and 604a~604d may be coupled to a corresponding one of the data buffers 541~545 and 551~554 through a data transmission line for receiving/transmitting the data signal DQ and the data strobe signal DQS.

The control device 590 may provide a command/address signal (e.g., CA) to the semiconductor memory devices 601a~601e through a command/address transmission line 561 and may provide a command/address signal to the semiconductor memory devices 602a~602e through a command/address transmission line 563. In addition, the control device 590 may provide a command/address signal to the semiconductor memory devices 603a~603d through a command/address transmission line 571 and may provide a command/address signal to the semiconductor memory devices 604a~604d through a command/address transmission line 573.

The command/address transmission lines 561 and 563 may be connected in common to the module resistance unit 560 disposed to be adjacent to the first edge portion 503, and the command/address transmission lines 571 and 573 may be connected in common to the module resistance unit 570 disposed to be adjacent to the second edge portion 505.

Each of the module resistance units 560 and 570 may include a termination resistor Rtt/2 connected to a termination voltage Vtt. In this case, an arrangement of the module resistance units 560 and 570 may reduce the number of the module resistance units, thus reducing an area where termination resistors are disposed. In addition, each of the plurality of semiconductor memory devices 601a~601e, 602a~602e, 603a~603d, and 604a~604d may be a DRAM device.

The SPD chip 580 is disposed to be adjacent to the control device 590 and the PMIC 585 may be disposed between the semiconductor memory device 603d and the second edge portion 505. The PMIC 585 may generate the power supply voltage VDD based on the input voltage VIN and may provide the power supply voltage VDD to the semiconductor memory devices 601a~601e, 602a~602e, 603a~603d, and 604a~604d. Although it is illustrated as the PMIC 585 is disposed to be adjacent to the second edge portion 505 in FIG. 22, the PMIC 585 may be disposed in a central portion of the circuit board 501 to be adjacent to the control device 590 in example embodiments.

Figure 23:
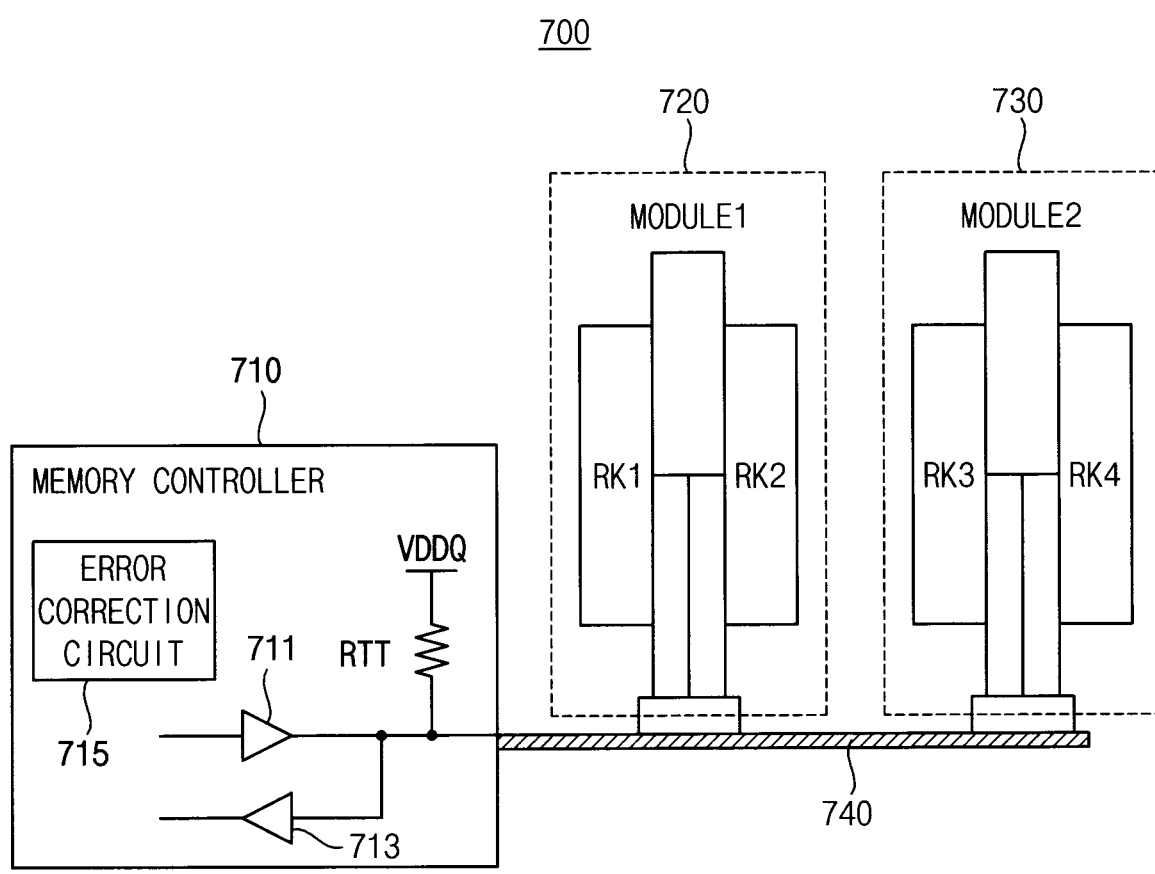
FIG. 23 is a block diagram illustrating a memory system having quad-rank memory modules according to example embodiments.

FIG. 23 is a block diagram illustrating a memory system having quad-rank memory modules according to example embodiments. Referring to FIG. 23, a memory system 700 may include a memory controller 710 and at least one or more memory modules 720 and 730. The memory controller 710 may control a memory module 720 and/or 730 so as to perform a command supplied from a processor or host. The memory controller 710 may be implemented in a processor or host, or may be implemented with an application processor or a system-on-a-chip (SoC).

For signal integrity, a source termination may be implemented with a resistor RTT on a bus 740 of the memory controller 710. The resistor RTT may be coupled to a power supply voltage VDDQ. The memory controller 710 may include a transmitter 711, to transmit a signal to the at least one or more memory modules 720 and 730, and a receiver 713 to receive a signal from the at least one or more memory modules 720 and 730. The memory controller 710 may include an error correction circuit 715 and the error correction circuit 715 may employ the Error correction circuit 130 of FIG. 6.

Therefore, the error correction circuit 715 includes an ECC encoder and an ECC decoder and the ECC decoder may perform an ECC decoding on a codeword from the at least one or more memory modules 720 and 730 to generate a first syndrome using a first check matrix of a parity check matrix and to generate a second syndrome using a second check matrix of the parity check matrix, may determine a type of errors in the codeword and a decoding mode based on the first syndrome and the second syndrome and may correct multi errors in multiple chips or three or more symbol errors in one chip based on the decoding mode.

The at least one or more memory modules 720 and 730 may be referred to as a first memory module 720 and a second memory module 730. The first memory module 720 and the second memory module 730 may be coupled to the memory controller 710 through the bus 740. Each of the first memory module 720 and the second memory modules 730 may correspond to the memory module MM in FIG. 1. The first memory module 720 may include at least one or more memory ranks RK1 and RK2, and the second memory module 730 may include one or more memory ranks RK3 and RK4. Each of the first memory module 720 and the second memory module 730 may include a plurality of data chips, a first parity chip and a second parity chip.

Figure 24:
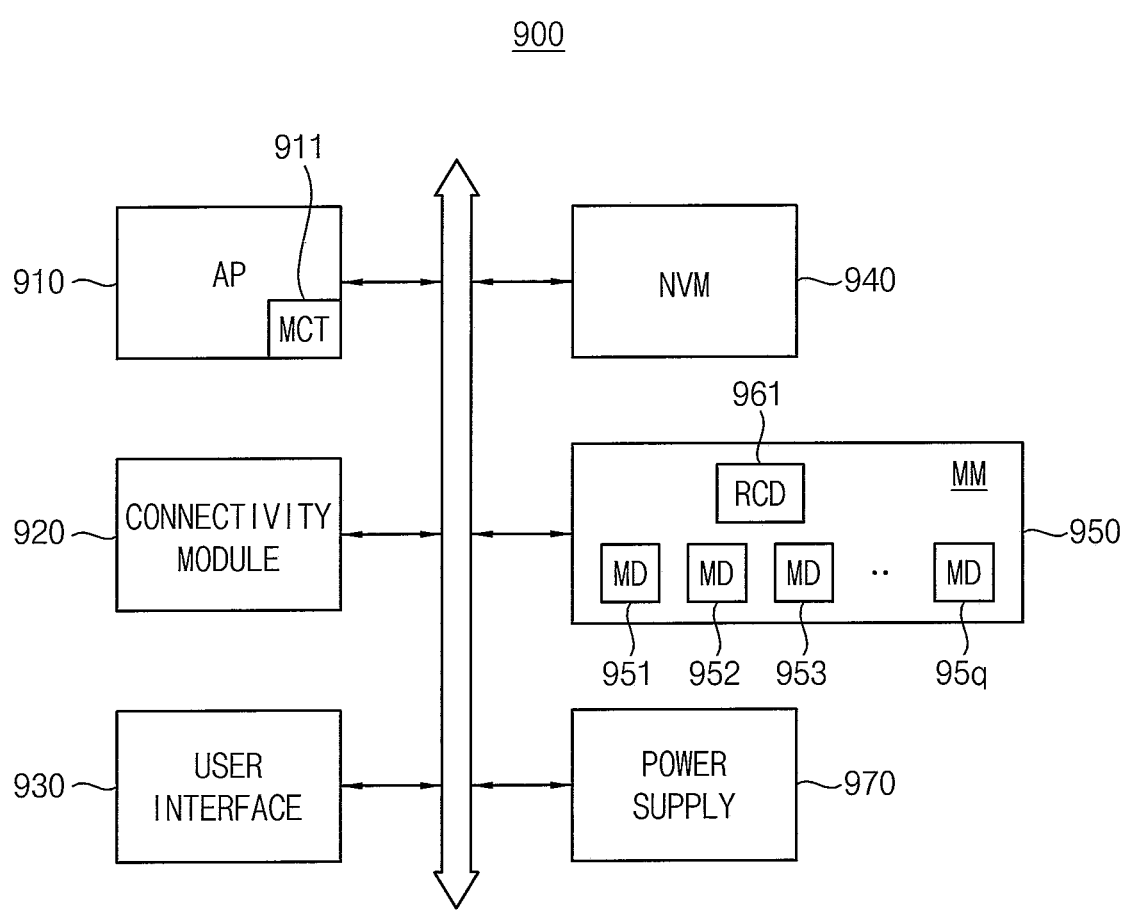
FIG. 24 is a block diagram illustrating a mobile system 900 including a memory module according to example embodiments.

FIG. 24 is a block diagram illustrating a mobile system 900 including a memory module according to example embodiments. Referring to FIG. 24, a mobile system 900 may include an application processor 910, a connectivity module 920, a memory module 950, a nonvolatile memory device 940, a user interface 930, and a power supply 970. The application processor 910 may include a memory controller (MCT) 911. The application processor 910 may execute applications, such as a web browser, a game application, a video player, etc. The connectivity module 920 may perform wired or wireless communication with an external device.

The memory module (MM) 950 may store data processed by the application processor 910 or operate as a working memory. The memory module 950 may include a plurality of semiconductor memory devices (MD) 951, 952, 953, and 95q (where q is a positive integer greater than three), and a control device 961.

The semiconductor memory devices 951, 952, 953, . . . 95q may include a plurality of data chips, a first parity chip and a second parity chip. Therefore, the memory controller 911 may perform an ECC decoding on a codeword from the memory modules 950 to generate a first syndrome using a first check matrix of a parity check matrix and to generate a second syndrome using a second check matrix of the parity check matrix, may determine a type of errors in the codeword and a decoding mode based on the first syndrome and the second syndrome and may correct multi errors in multiple chips or three or more symbol errors in one chip based on the decoding mode.

The nonvolatile memory device 940 may store a boot image for booting the mobile system 900. The user interface 930 may include at least one input device, such as a keypad, a touch screen, etc., and at least one output device, such as a speaker, a display device, etc. The power supply 970 may supply an operating voltage to the mobile system 900. The mobile system 900 or components of the mobile system 900 may be mounted using various types of packages.

Example embodiments may be applied to various systems including a memory module and a memory controller that includes an error correction circuit.

While the present disclosure has been particularly shown and described with reference to the example embodiments thereof, it will be understood by those of ordinary skill in the art that various changes in form and detail may be made therein without departing from the spirit and scope of the present disclosure as defined by the following claims.

What is claimed is:

1. An error correction circuit, comprising:
an error correction code (ECC) decoder configured to:
perform an ECC decoding on a codeword read from a memory module to generate a first syndrome and a second syndrome;
generate a decoding mode flag that designates a type of error(s) in the codeword; and
selectively correct one of a chip error and one or more symbol errors in the codeword using a first decoding mode when the decoding mode flag designates a first type of error in the codeword and a second decoding mode when the decoding mode flag designates a second type of error in the codeword, the chip error being associated with a data chip in the memory module.

2. The error correction circuit of claim 1, wherein the ECC decoder is further configured to:
operate in the first decoding mode in response to: (i) the second syndrome indicating that the codeword includes one symbol error, and (ii) the first syndrome being non-zero; and
correct the one symbol error.

3. The error correction circuit of claim 1, wherein the ECC decoder is further configured to:
operate in the first decoding mode in response to: (i) the second syndrome indicating that the codeword includes two symbol errors having the same pattern, and (ii) the first syndrome being non-zero; and
correct the two symbol errors.

4. The error correction circuit of claim 1, wherein the ECC decoder is further configured to:
operate in the first decoding mode in response to: (i) the second syndrome indicating that the codeword includes two symbol errors having different and random patterns, and (ii) the first syndrome being non-zero; and
correct the two symbol errors.

5. The error correction circuit of claim 1, wherein the ECC decoder is further configured to:
operate in the second decoding mode in response to: (i) the second syndrome indicating that the codeword includes three or more symbol errors, (ii) the first syndrome being non-zero, and (iii) the second decoding mode corresponding to a chip-kill mode; determine that the three or more symbol errors occur in a first data chip within the memory module; and
correct user data provided from the first data chip.

6. The error correction circuit of claim 5, wherein when a symbol error occurs in a second data chip within the memory module, which is different from the first data chip, after the ECC decoder corrects the three or more symbol errors in the user data provided from the first data chip, the ECC decoder operates in the first decoding mode to correct the symbol error in user data provided from the second data chip using a parity check matrix.

7. The error correction circuit of claim 1, wherein the memory module includes a plurality of data chips, a first parity chip and a second parity chip; and wherein:

the codeword includes a user data set, a first parity data and a second parity data;

the user data set is read from the plurality of data chips;

the first parity data is read from the first parity chip; and the first second parity data is read from the second parity chip, and wherein a parity check matrix within a memory within the error correction circuit includes:

a first check matrix, which is generated using a Reed-Solomon code and is used for generating the first syndrome; and a second check matrix, which is generated using a simple parity check code and is used for generating the second syndrome.

8. The error correction circuit of claim 7, wherein the ECC decoder is further configured to:

generate the first syndrome by performing a matrix-multiplication operation on the codeword and the first check matrix; and generate the second syndrome by performing a simple parity check on the codeword using the second check matrix.

9. The error correction circuit of claim 7, wherein:

the first check matrix includes a plurality of Galois field sub matrixes corresponding to the data chips and the first parity chip, and each of the plurality of Galois field sub matrixes has p×p elements, p being an integer greater than three; and the second check matrix includes a plurality of unit sub matrixes corresponding to the data chips and, the first parity chip and the second parity chip, and each of the plurality of unit sub matrixes has p×p elements.

10. The error correction circuit of claim 9, wherein each of the of unit sub matrixes includes a plurality of unit matrixes arranged in a diagonal direction, with each of the plurality of unit matrixes having q'q elements, q being an integer greater than one and smaller than p.

11. The error correction circuit of claim 1, wherein the ECC decoder includes:

a syndrome generation circuit configured to generate the first syndrome from the codeword using a first parity check matrix, generate the second syndrome from the codeword using a second parity check matrix, and generate the decoding mode flag from the first syndrome and the second syndrome;

a first decoder configured to correct the chip error in the codeword using the first syndrome and the second syndrome, to provide a first output data set;

a second decoder configured to correct the one or more symbol errors in the codeword using the first syndrome, to provide a second output data set; and a selection circuit configured to select one of the first output data set and the second output data set to output a corrected user data set.

12. The error correction circuit of claim 11, wherein the syndrome generation circuit includes:

a first syndrome generator configured to generate the first syndrome by performing a matrix-multiplication operation on the codeword and the first parity check matrix;

a second syndrome generator configured to generate the second syndrome by performing a simple parity check on the codeword using the second parity check matrix; and a flag generator configured to generate the decoding mode flag indicating the type of errors using the first syndrome and the second syndrome.

13. The error correction circuit of claim 11, wherein the first decoder is configured to:

generate a plurality of sub syndromes corresponding to respective one of the plurality of data chips from the second syndrome and the parity check matrix; and determine a data chip in which the chip error occurs, among the plurality of data chips, from a comparison of the sub syndromes and the first syndrome.

14. The error correction circuit of claim 1, further comprising an ECC encoder configured to:

perform ECC encoding on a user data set to generate a first parity data and a second parity data using a parity generation matrix; and provide the memory module with a codeword including the user data set, the first parity data and the second parity data.

15. The error correction circuit of claim 14, wherein the parity generation matrix includes a first parity generation matrix and a second parity generation matrix; and wherein the ECC encoder is configured to:

generate the first parity data by performing a matrix-multiplication operation on the user data set and the first parity generation matrix; and generate the second parity data by performing a simple parity check on the user data set and the first parity data using the second parity generation matrix.

16. A memory system, comprising:

a memory module having a plurality of data chips, a first parity chip and a second parity chip therein; and a memory controller configured to control the memory module, the memory controller comprising:

an error correction circuit comprising an error correction code (ECC) decoder and a memory configured to store a parity check matrix, said the ECC decoder configured to:

perform an ECC decoding on a codeword, which is read from the memory module, to generate a first syndrome and a second syndrome;

generate a decoding mode flag that designates a type of errors in the codeword; and selectively correct one of a chip error in the codeword and one or more symbol errors in the codeword using a first decoding mode when the decoding mode flag designates a first type of error in the codeword and a second decoding mode when the decoding mode flag designates a second type of error in the codeword, the chip error being associated with one of the data chips.

17. The memory system of claim 16, wherein the ECC decoder is configured to:

operate in the first decoding mode in response to the second syndrome indicating that the codeword includes one or two symbol errors and the first syndrome being non-zero; and correct the one symbol error and the two symbol errors to output a corrected user data set.

18. The memory system of claim 16, wherein the ECC decoder is configured to:

operate in the second decoding mode in response to the second syndrome indicating that the codeword includes three or more symbol errors and, the first syndrome being non-zero, and the second decoding mode corresponding to a chip-kill mode;

determine that the three or more symbol errors occur in a first data chips of the data chips; and correct user data provided from the first data chip.

19. The memory system of claim 16, wherein the parity check matrix includes:

a first check matrix, which is generated using a Reed-Solomon code and is used for generating the first syndrome; and a second check matrix which is generated using a simple parity check code and is used for generating the second syndrome; and wherein the ECC decoder includes:

a syndrome generation circuit configured to generate the first syndrome from the codeword using a first parity check matrix, generate the second syndrome from the codeword using a second parity check matrix, and generate the decoding mode flag from the first syndrome and the second syndrome;

a first decoder configured to correct the chip error in the codeword using the first syndrome and the second syndrome, to provide a first output data set;

a second decoder configured to correct the one or more symbol errors in the codeword using the first syndrome, to provide a second output data set; and a selection circuit configured to select one of the first output data set and the second output data set to output a corrected user data set.

20. A memory controller configured to control a memory module including a plurality of data chips, a first parity chip and a second parity chip, the memory controller comprising:

an error correction circuit including an error correction code (ECC) encoder, an ECC decoder and a memory, which is configured to store a parity generation matrix and a parity check matrix;

wherein the ECC encoder is configured to:

perform ECC encoding on a user data set to generate a first parity data and a second parity data using the parity generation matrix; and provide the memory module with a codeword including the user data set, the first parity data and the second parity data; and wherein the ECC decoder is configured to:

perform an ECC decoding on a codeword read from the memory module to generate a first syndrome and a second syndrome;

generate a decoding mode flag that designates a type of error(s) in the codeword; and selectively correct one of a chip error and one or more symbol errors in the codeword using a first decoding mode when the decoding mode flag designates a first type of error in the codeword and a second decoding mode when the decoding mode flag designates a second type of error in the codeword, the chip error being associated with one of the data chips.

* * * * *